(12) United States Patent
Seo et al.

(10) Patent No.: US 12,085,817 B2
(45) Date of Patent: Sep. 10, 2024

(54) DISPLAY DEVICE

(71) Applicant: LG Display Co., Ltd., Seoul (KR)

(72) Inventors: Daeyoung Seo, Paju-si (KR); Hun Jang, Paju-si (KR); Soyoung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 349 days.

(21) Appl. No.: 17/390,521

(22) Filed: Jul. 30, 2021

(65) Prior Publication Data
US 2022/0037452 A1    Feb. 3, 2022

(30) Foreign Application Priority Data
Jul. 31, 2020    (KR) .................... 10-2020-0096365

(51) Int. Cl.
*G02F 1/1345*    (2006.01)
*G02F 1/01*    (2006.01)
*G09G 3/3225*    (2016.01)
*H10K 59/131*    (2023.01)

(52) U.S. Cl.
CPC ........ *G02F 1/13452* (2013.01); *G02F 1/0123* (2013.01); *G02F 1/13454* (2013.01); *G02F 1/13456* (2021.01); *G09G 3/3225* (2013.01); *H10K 59/131* (2023.02)

(58) Field of Classification Search
None
See application file for complete search history.

(56) References Cited

U.S. PATENT DOCUMENTS 10,192,935 B2    1/2019    Shim et al.
10,424,630 B2    9/2019    Han et al.
2019/0035874 A1*    1/2019    Han .................... G09G 3/3233

FOREIGN PATENT DOCUMENTS

| KR | 10-2015-0076485 A | 7/2015 |
| KR | 10-2016-0083532 A | 7/2016 |
| KR | 10-2018-0014339 A | 2/2018 |
| KR | 10-2018-0025520 A | 3/2018 |
| KR | 10-2019-0002884 A | 1/2019 |
| KR | 10-2019-0013132 A | 2/2019 |
| KR | 10-2019-0070768 A | 6/2019 |
| KR | 10-2019-0076637 A | 7/2019 |

* cited by examiner

*Primary Examiner* — Dung T Nguyen
(74) *Attorney, Agent, or Firm* — Birch, Stewart, Kolasch & Birch, LLP

(57) ABSTRACT

A display device according to an example includes a first power sharing line disposed to be parallel with a first direction, first and second pixels disposed along a second direction crossing the first direction with the first power sharing line interposed therebetween, and a second power sharing line disposed to be parallel with the first power sharing line with any one of the first and second pixels interposed therebetween.

18 Claims, 16 Drawing Sheets

GAT

DR_GAT

ST_GAT
SW_GAT

DISPLAY DEVICE

CROSS-REFERENCE TO RELATED APPLICATIONS

This application claims the priority benefit of the Korean Patent Application No. 10-2020-0096365 filed on Jul. 31, 2020 in the Republic of Korea, the entire contents of which are hereby expressly incorporated by reference as if fully set forth herein into the present application.

BACKGROUND

Field of the Invention

The present disclosure relates to a display device.

Discussion of the Related Art

With the advancement of the information age, the demand for a display device for displaying an image has increased with various forms. Therefore, various types of display devices such as a liquid crystal display (LCD) device, a plasma display panel (PDP) device, and an organic light emitting display (OLED) device have been recently used.

Among such display devices, the organic light emitting display device is a self-luminance display device using an organic light emitting diode which injects holes from an anode and electrons from a cathode into a light emitting layer and emits light when an exciton generated by the combination of the injected holes and electrons changes its state from an excited state to a ground state.

The organic light emitting display device can be categorized into a top emission type, a bottom emission type, and a dual emission type depending on an emitted direction of light, and can be categorized into a passive matrix type and an active matrix type depending on a driving method.

The organic light emitting display device does not need a separate light source unlike a liquid crystal display (LCD) device and thus can be manufactured into a lightweight and thin form. Further, the organic light emitting display device is advantageous in view of power consumption since it is driven with a low voltage. Further, the organic light emitting display device has excellent color expression ability, a high response speed, a wide viewing angle, and a high contrast ratio (CR). Therefore, the organic light emitting display device has been researched as the next-generation display device.

The organic light emitting display device includes a storage capacitor to maintain a certain current when emitting light. The storage capacitor is provided per pixel and occupies a certain area, whereby an aperture ratio is reduced. The aperture ratio has recently become an important issue in accordance with the trend of high resolution of the display device. A current density of the light emitting diode can be lowered by enhancing the aperture ratio, whereby lifespan of the light emitting diode can be increased. Since adaptability of the display device of high resolution is enhanced, an organic light emitting display device having a high aperture ratio is needed.

The disclosure of the above-described background art is owned by the inventor(s) of the present disclosure to devise the present disclosure or is technical information acquired by a process of devising the present disclosure, but cannot be regarded as the known art disclosed to the general public before the present disclosure is disclosed.

SUMMARY OF THE DISCLOSURE

The present disclosure has been made in view of the above issues and other limitations associated with the related art, and it is an object of the present disclosure to provide a display device that can improve an aperture ratio within a limited space of a subpixel, simplify a structure and reduce load deviation of sensing lines.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display device comprising a first power sharing line disposed to be parallel with a first direction, first and second pixels disposed along a second direction crossing the first direction with the first power sharing line interposed therebetween, and a second power sharing line disposed to be parallel with the first power sharing line with any one of the first and second pixels interposed therebetween.

In accordance with another aspect of the present disclosure, the above and other objects can be accomplished by the provision of a display device comprising a plurality of pixels having a plurality of subpixels arranged along a first direction and a second direction crossing the first direction, a first power sharing line disposed between a first pixel disposed in a (2i)th (i is a natural number) horizontal line among the plurality of pixels and a second pixel disposed in a (2i−1)th horizontal line, and a second power sharing line disposed at one side of the first pixel or the other side of the second pixel.

In the display device according to the present disclosure, the driving thin film transistor can be disposed at the upper side based on the light emission area of each subpixel, the power lines of the subpixels adjacent to each other up and down can be shared, and the number of sensing line contact holes of the respective subpixels can be reduced, whereby an aperture ratio can be improved within a limited space of the subpixel, a structure can be simplified, and load deviation of the sensing lines can be reduced. As a result, display performance can be improved by luminance increase based on improvement of the aperture ratio, and lifespan of the light emitting diode can be improved.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
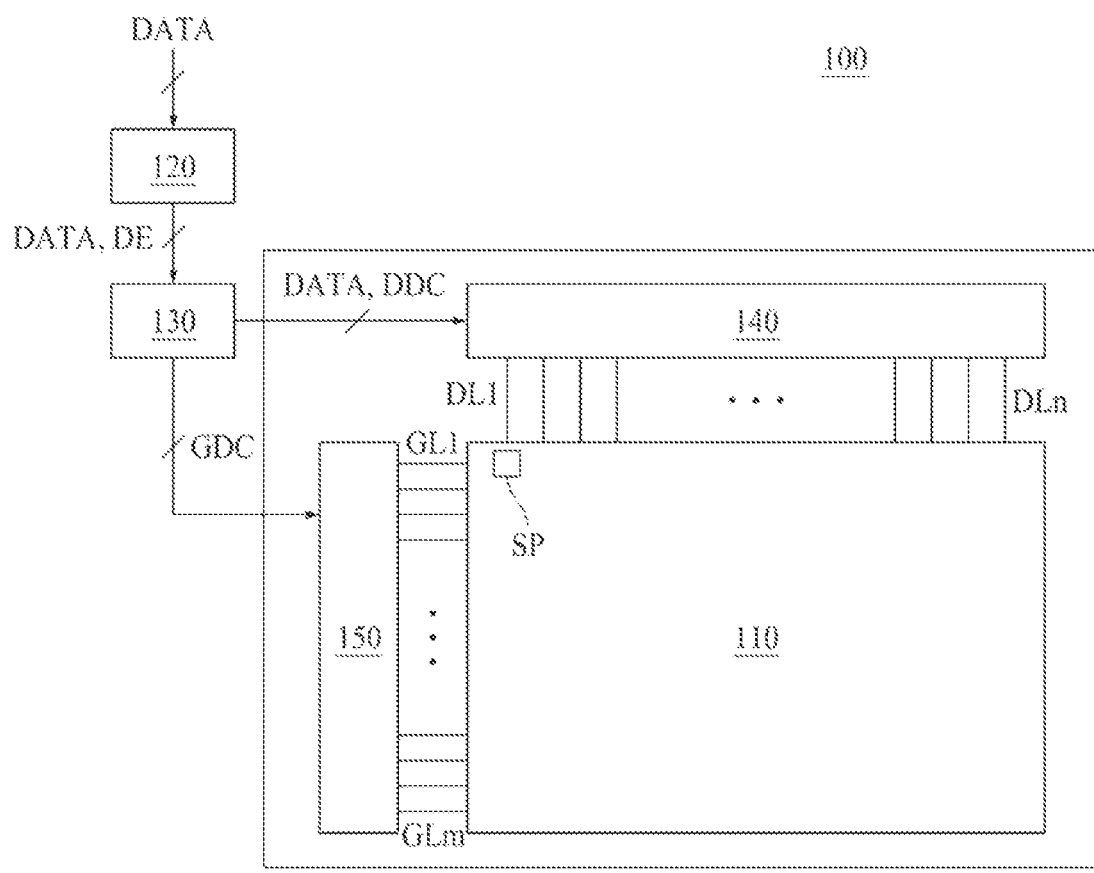
FIG. 1 is a schematic block view illustrating a display device according to various embodiments of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description may be omitted or may be provided briefly.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a temporal relationship, for example, when the temporal order is described as "after," "subsequent," "next," and "before," a case which is not continuous can be included, unless "just" or "direct" is used.

It will be understood that, although the terms "first", "second", etc. can be used herein to describe various elements, these elements should not be limited by these terms. These terms are only used to partition one element from another. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and can be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, a preferred embodiment of a display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
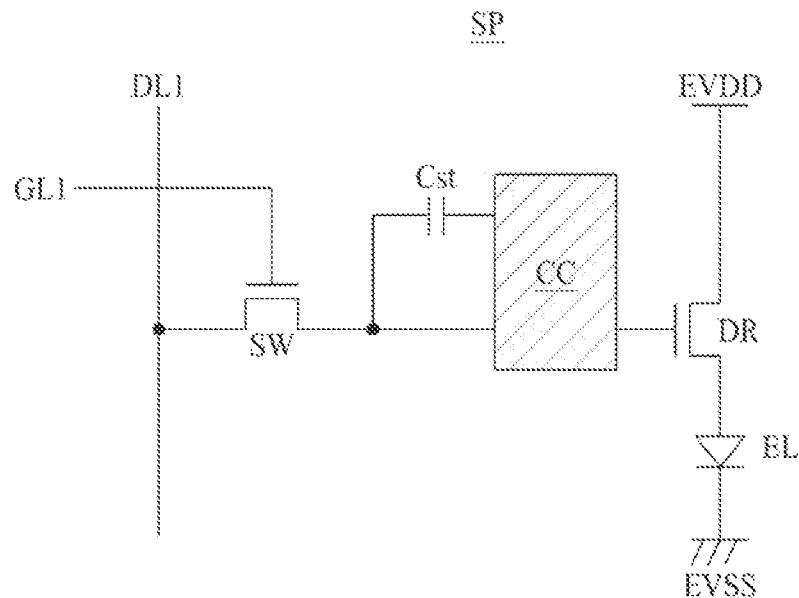
FIG. 2 is a schematic circuit driving view illustrating a subpixel of the display device of FIG. 1.
Figure 3:
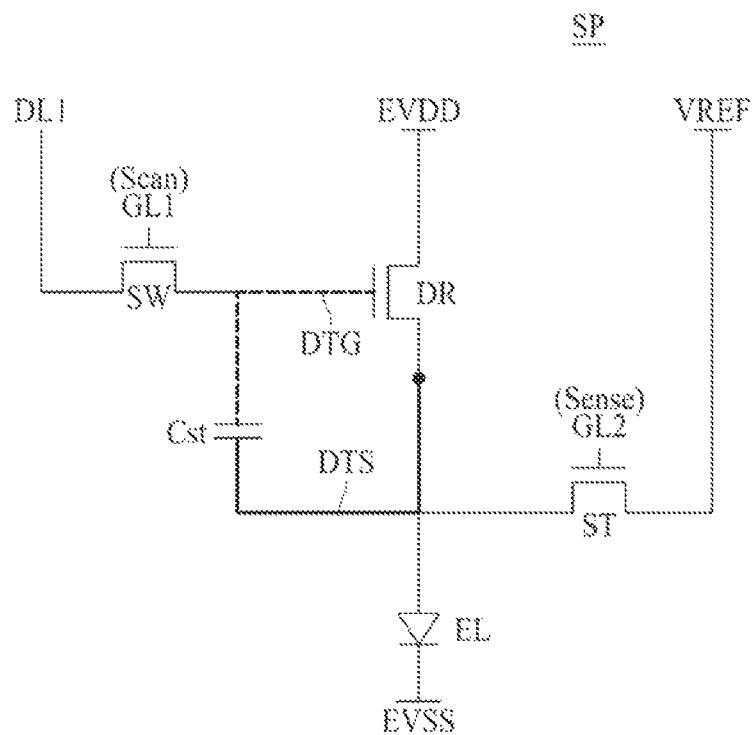
FIG. 3 is an equivalent circuit view illustrating an example of a subpixel of the display device shown in FIG. 1.

FIG. 1 is a schematic block view illustrating a display device according to various embodiments of the present disclosure. FIG. 2 is a schematic circuit driving view illustrating a subpixel of the display device of FIG. 1. FIG. 3 is an equivalent circuit view illustrating an example of a subpixel of the display device shown in FIG. 1. All components of each display device according to all embodiments of the present disclosure are operatively coupled and configured.

Referring to FIGS. 1 to 3, a display device 100 according to various embodiments of the present disclosure can include a display panel 110, an image processor 120, a timing controller 130, a data driver 140, and a scan driver 150.

The display panel 110 can display an image in response to a data signal DATA and a scan signal, which are respectively supplied from the data driver 140 and the scan driver 150. The display panel 100 can include subpixels SP that operate to display an image.

The subpixel can be formed in a top-emission type, a bottom-emission type, or a dual-emission type in accordance with a structure. The subpixels SP can include a red subpixel, a green subpixel, and a blue subpixel, or can include a red subpixel, a blue subpixel, a white subpixel and a green subpixel, but the present disclosure is not limited thereto. The subpixels SP can have one or more different light emission areas in accordance with light emission characteristics.

The image processor 120 can output a data enable signal DE together with the data signal DATA supplied from the outside. The image processor 120 can output one or more of a vertical synchronization signal, a horizontal synchronization signal and a clock signal in addition to the data enable signal DE, but these signals will be omitted without being shown for convenience of description.

The timing controller 130 can be supplied with the data signal DATA together with a driving signal, which includes the data enable signal DE or the vertical synchronization signal, the horizontal synchronization signal and the clock signal, from the image processor 120. The timing controller 130 can output a data timing control signal DDC for controlling an operation timing of the data driver 140 and a gate timing control signal GDC for controlling an operation timing of the scan driver 150 on the basis of the driving signal.

The data driver 140 can sample and latch the data signal DATA supplied from the timing controller 130 in response to the data timing control signal DDC supplied from the timing controller 130, convert the latched data signal into a gamma reference voltage and output the converted gamma reference voltage. The data driver 140 can output the data signal DATA through data lines DL1 to DLn, where n can be a positive number such as integer greater than 1. The data driver 140 can be embodied in the form of an Integrated Circuit (IC).

The scan driver 150 can output the scan signal in response to the gate timing control signal GDC supplied from the timing controller 130. The scan driver 150 can output the scan signal through gate lines GL1 to GLm, where m can be a positive number such as an integer greater than 1. The scan driver 150 can be embodied in the form of IC(Integrated Circuit), or can be embodied in the display panel 110 in a Gate In Panel (GIP) type.

As shown in FIG. 2, one subpixel SP constituting a unit pixel can include a switching thin film transistor SW, a driving thin film transistor DR, a storage capacitor Cst, a compensation circuit CC, and a light emitting diode EL.

The switching thin film transistor SW can perform a switching operation to store a data signal supplied through the first data line DL1 in the storage capacitor Cst as a data voltage in response to the scan signal supplied through the first gate line GL1. The driving thin film transistor DR can operate to flow a driving current between a first power line EVDD (e.g., high potential voltage) and a common power line EVSS (e.g., low potential voltage) in accordance with the data voltage stored in the storage capacitor Cst. The light emitting diode EL can operate to emit light in accordance with the driving current formed by the driving thin film transistor DR.

The compensation circuit CC is a circuit added within the subpixel to compensate for a threshold voltage of the driving thin film transistor DR. The compensation circuit CC can include one or more thin film transistors. The compensation circuit CC can have various configurations in accordance with a compensation method and thus its example will be described as follows.

As shown in FIG. 3, the compensation circuit CC can include a sensing thin film transistor ST and a sensing line VREF (or a reference line or a second power line).

The sensing thin film transistor ST can be connected between a drain electrode of the driving thin film transistor DR and an anode electrode of the light emitting diode EL (hereinafter, sensing node). The sensing thin film transistor ST can operate to supply an initialization voltage (or sensing voltage) transferred through the sensing line VREF to the sensing node of the driving thin film transistor DR or sense the sensing node of the driving thin film transistor DR or a voltage or current of the sensing line VREF.

A first electrode (e.g., source electrode) of the switching thin film transistor SW can be connected to the first data line DL1, and a second electrode (e.g., drain electrode) of the switching thin film transistor SW can be connected to a gate electrode of the driving thin film transistor DR.

A first electrode (e.g., source electrode) of the driving thin film transistor DR can be connected to the first power line EVDD, and a second electrode (e.g., drain electrode) of the driving thin film transistor DR can be connected to an anode electrode of the light emitting diode EL.

The storage capacitor Cst can include a first electrode connected to the gate electrode of the driving thin film transistor DR, and a second electrode connected to the anode electrode of the light emitting diode EL. In the display device according to various embodiments of the present disclosure, the storage capacitor Cst can include a first electrode pattern DTG connected to the gate electrode of the driving thin film transistor DR and a second electrode pattern DTS connected to the source electrode of the driving thin film transistor DR. The first and second electrode patterns DTG and DTS can be formed by conductorizing an active layer. Further, the storage capacitor Cst can include a first capacitor formed in a horizontal direction and a second capacitor formed in a vertical direction in accordance with various modifications of the first electrode pattern DTG and the second electrode pattern DTS. For example, each of the first and second electrode patterns DTG and DTS can include a finger pattern structure in which the first and second electrode patterns are disposed to be parallel on the same plane. A horizontal capacitor can be formed by the structures spaced apart from each other in the horizontal direction. The storage capacitor Cst will be described later in more detail.

The anode electrode of the light emitting diode EL can be connected to the second electrode of the driving thin film transistor DR, and its cathode electrode can be connected to the common power line EVSS. For example, the light emitting diode EL can be an Organic Light Emitting Diode (OLED).

A first electrode (e.g., source electrode) of the sensing thin film transistor ST can be connected to the sensing line VREF, and its second electrode (e.g., drain electrode) can be connected the anode electrode of the light emitting diode EL and the second electrode of the driving thin film transistor DR, which are sensing nodes.

The operation time of the sensing thin film transistor ST can be similar to, the same as, or different from that of the switching thin film transistor SW in accordance with a compensation algorithm (or configuration of the compensation circuit). For example, the gate electrode of the switching thin film transistor SW can be connected to the first gate line GL1, and the gate electrode of the sensing thin film transistor ST can be connected to the second gate line GL2. In this case, the scan signal Scan can be transferred to the first gate line GL1, and a sensing signal Sense can be transferred to the second gate line GL2. For another example, the first gate line GL1 connected to the gate electrode of the switching thin film transistor SW and the second gate line GL2 connected to the gate electrode of the sensing thin film transistor ST can be connected to each other.

The sensing line VREF can be connected to the data driver 140. In this case, the data driver 140 can sense the sensing node of the subpixel for a real time, a non-display period of an image or N frame period (N is an integer of 1 or more), and can generate the sensed result. Meanwhile, the switching thin film transistor SW and the sensing thin film transistor ST can be turned on at the same time. In this case, a sensing operation through the sensing line VREF and a data output operation for outputting a data signal can be separated (divided) from each other by a time division method of the data driver 140.

In addition, a compensation target based on the sensed result can be a digital type data signal, an analog type data signal, or gamma voltage. A compensation circuit for generating a compensation signal (or compensation voltage) based on the sensed result can be embodied as an internal circuit of the data driver 140, an internal circuit of the timing controller 130 or a separate circuit.

Further, in the example of FIG. 3, although the subpixel of a 3T (Transistor) 1C (Capacitor) structure that includes the switching thin film transistor SW, the driving thin film transistor DR, the storage capacitor Cst, the light emitting diode EL, and the sensing thin film transistor ST has been described as an example, each subpixel can have a structure of 3T2C, 4T2C, 5T1C, 6T2C, etc. when the compensation circuit CC is added thereto.

Figure 4:
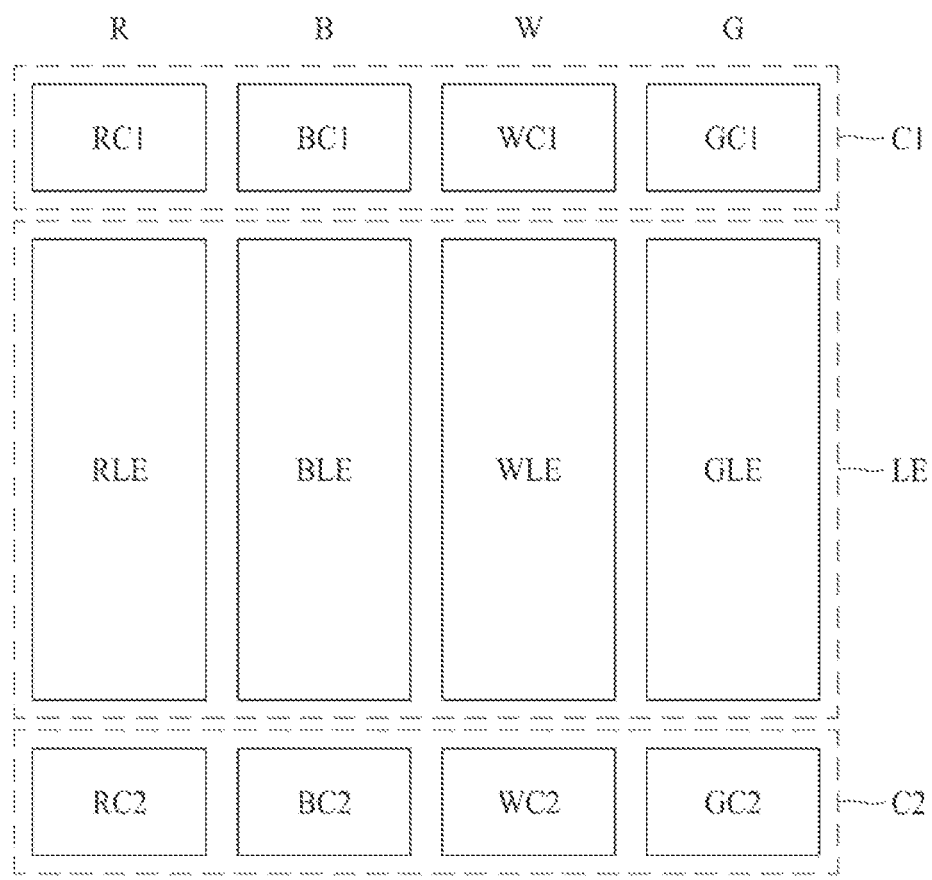
FIG. 4 is a schematic plane view illustrating a unit pixel of a display device according to various embodiments of the present disclosure.

FIG. 4 is a schematic plane view illustrating a unit pixel of a display device according to various embodiments of the present disclosure. FIG. 4 briefly illustrates a unit pixel comprised of the subpixels of FIG. 3.

Referring to FIG. 4, a unit pixel of the display device according to various embodiments of the present disclosure can be comprised of first to fourth subpixels R, B, W and G including a red subpixel R, a blue subpixel B, a white subpixel W and a green subpixel G. However, the present disclosure is not limited to this example of FIG. 4, and the unit pixel can be comprised of first to third subpixels R, G and B including a red subpixel R, a green subpixel G and a blue subpixel B. Further, various modifications can be made in arrangement of at least three or four subpixels included in the unit pixel. In the following description, a 3T1C subpixel will be described as an example.

Each of the first to fourth subpixels R, B, W and G can include an opening area LE where a light emission area is positioned, and first and second circuit areas C1 and C2 respectively disposed at both sides (for example, upper side and lower side of the drawing) of the opening area (or light emission area) LE. For example, in the display device according to various embodiments of the present disclosure, the first circuit area C1 and the second circuit area C2 in each of the subpixels R, B, W and G can be separated from each other based on the opening area LE.

In the display device according to various embodiments of the present disclosure, driving thin film transistors DR included in the first to fourth subpixels R, B, W and G can respectively be disposed in first circuit areas RC1, BC1, WC1 and GC1, and switching thin film transistors SW and sensing thin film transistors ST can respectively be disposed in second circuit areas RC2, BC2, WC2 and GC2, and storage capacitors Cst can respectively be overlapped with opening areas RLE, BLE, WLE and GLE and disposed between the first circuit areas RC1, BC1, WC1 and GC1 and the second circuit areas RC2, BC2, WC2 and GC2.

Since the display device according to various embodiments of the present disclosure includes a first circuit area C1 and a second circuit area C2 at both upper and lower sides based on the opening area LE of the subpixels R, B, W and G, the subpixels R, B, W and G of different rows adjacent to one another can disposed in a mirror shape to share a line common among them, whereby an effect for increasing an aperture ratio can be obtained.

Figure 5:
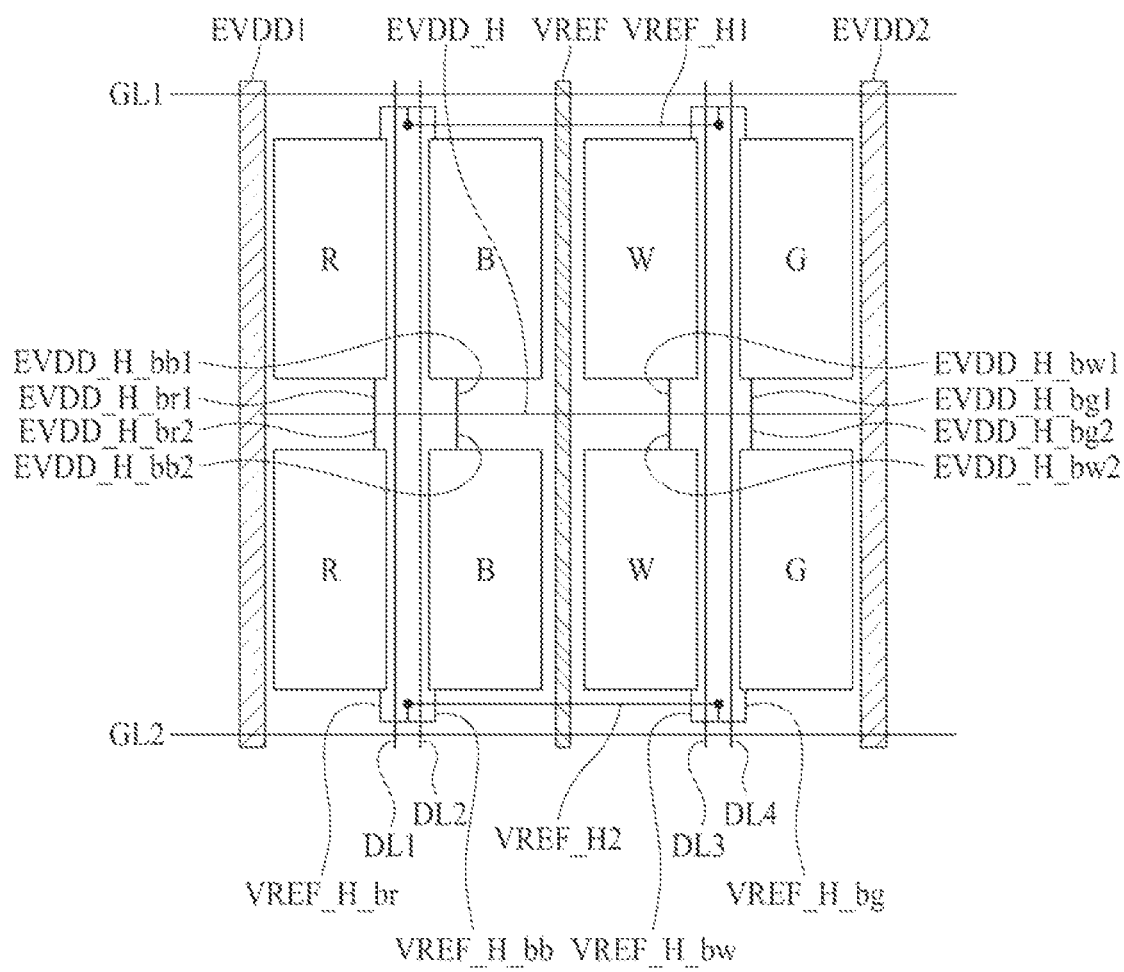
FIG. 5 is a schematic plane view illustrating a relation of the unit pixel of FIG. 4, a power supply line and a signal supply line.

FIG. 5 is a schematic plane view illustrating a relation of the unit pixel of FIG. 4, a power supply line and a signal supply line.

Referring to FIG. 5, the display device according to various embodiments of the present disclosure can include four first to fourth subpixels R, B, W and G constituting one unit pixel, a plurality of first power lines EVDD1 and EVDD2, data lines DL1 to DL4, gate lines GL1 and GL2 and a second power line VREF.

The respective subpixels R, B, W and G constituting one unit pixel can repeatedly be arranged to be spaced apart from one another along a first direction (e.g., horizontal direction) to constitute one row. Arrangement of the subpixels of one row can repeatedly be applied along a second direction (e.g., vertical direction) crossing the first direction to constitute a pixel array that includes subpixels R, B, W and G of a plurality of rows.

The plurality of first power lines EVDD1 and EVDD2 can be extended in parallel along the second direction with four first to fourth subpixels R, B, W and G constituting one unit pixel interposed therebetween. The plurality of first power lines EVDD1 and EVDD2 can be separated with the unit pixel adjacent thereto in the first direction. For example, the plurality of first power lines EVDD1 and EVDD2 can respectively be disposed at a left side of the first subpixels R and a right side of the fourth subpixels G, which are arranged in the second direction. A first power sharing line EVDD_H extended in the first direction and electrically connected with the first power lines EVDD1 and EVDD2 of left and right sides can be included between the plurality of first power lines EVDD1 and EVDD2. The first power sharing line EVDD_H can be formed between the plurality of first power lines EVDD1 and EVDD2 in a straight-line shape. The plurality of first power lines EVDD1 and EVDD2 can be connected to the driving thin film transistors DR disposed in the first circuit area of the first to fourth subpixels R, B, W and G through the first power sharing line EVDD_H.

In the display device according to various embodiments of the present disclosure, the first power sharing line EVDD_H can be disposed between first to fourth subpixels R, B, W and G (e.g., unit pixel positioned at a lower side in FIG. 5) disposed in a (2i)th (i is a natural number) horizontal line and first to fourth subpixels R, B, W and G (e.g., unit pixel positioned at an upper side in FIG. 5) disposed in a (2i−1)th horizontal line. For example, the first to fourth subpixels R, B, W and G disposed in the (2i)th horizontal line and the first to fourth subpixels R, B, W and G disposed in the (2i−1)th horizontal line can be disposed to be symmetrical to each other in a mirror shape, and a first circuit area of the first to fourth subpixels R, B, W and G disposed in the (2i)th horizontal line and a first circuit area of the first to fourth subpixels R, B, W and G disposed in the (2i−1)th horizontal line can be disposed to be adjacent to each other with the first power sharing line EVDD_H interposed therebetween.

The first power sharing line EVDD_H can commonly be connected to each of the first to fourth subpixels R, B, W and G disposed in the (2i)th horizontal line and the first to fourth subpixels R, B, W and G disposed in the (2i−1)th horizontal line. For example, the first power sharing line EVDD_H can be connected to each of the driving thin film transistors DR disposed in the first circuit area of the first to fourth subpixels R, B, W and G disposed in the (2i)th horizontal line and connected to each of the driving thin film transistors DR disposed in the first circuit area of the first to fourth subpixels R, B, W and G disposed in the (2i−1)th horizontal line.

The four first to fourth subpixels R, B, W and G constituting one unit pixel can include first branch power patterns extended in a second direction oriented toward the first power sharing line EVDD_H. For example, the respective subpixels R, B, W and G can include a first branch power pattern EVDD_H_br1, 2 connecting the first subpixel R with the first power sharing line EVDD_H, a first branch power pattern EVDD_H_bb1, 2 connecting the second subpixel B with the first power sharing line EVDD_H, a first branch power pattern EVDD_H_bw1, 2 connecting the third subpixel W with the first power sharing line EVDD_H, and a first branch power pattern EVDD_H_bg1, 2 connecting the fourth subpixel G with the first power sharing line EVDD_H.

The data lines DL1 to DL4 can be disposed to be parallel to be extended along the second direction between the first and second subpixels R and B and between the third and fourth subpixels W and G. For example, the first and second data lines DL1 and DL2 can be disposed in parallel between the first and second subpixels R and B, and the third and fourth data lines DL3 and DL4 can be disposed in parallel between the third and fourth subpixels W and G. Each of the data lines DL1 to DL4 can supply the data signal to the switching thin film transistors SW disposed in the second circuit area of the subpixels R, B, W and G adjacent thereto.

The gate lines GL1 and GL2 can be extended along the first direction at the position corresponding to the second circuit area of the four first to fourth subpixels R, B, W and G constituting one unit pixel and disposed in parallel along the first direction. For example, the first gate line GL1 can be disposed along the first direction at the position corresponding to the second circuit area of the first to fourth subpixels R, B, W and G disposed in the (2i−1)th horizontal line, and the second gate line GL2 can be disposed along the first direction at the position corresponding to the second circuit area of the first to fourth subpixels R, B, W and G disposed in the (2i)th horizontal line.

The second power line VREF can be disposed between the plurality of first power lines EVDD1 and EVDD2 and extended along the second direction. For example, the second power line VREF can be disposed to be parallel with the plurality of first power lines EVDD1 and EVDD2 between the second subpixels B and the third subpixels W. The second power line VREF can include a second power sharing line VREF_H extended toward left and right sides in a horizontal direction. The second power sharing line VREF_H can be formed to be extended to left and right sides based on the center connected with the second power line. The second power line VREF can be connected to the sensing thin film transistors ST, which are disposed in the second circuit area of the first to fourth subpixels R, B, W and G, through the second power sharing line VREF_H.

In the display device according to various embodiments of the present disclosure, second power sharing lines VREF_H1,2 can be disposed to be parallel with the first power sharing line EVDD_H with first to fourth subpixels R, B, W and G (e.g., unit pixel positioned at a lower side in FIG. 5) disposed in a (2i)th (i is a natural number) horizontal line interposed therebetween, and can be disposed to be parallel with the first power sharing line EVDD_H with first to fourth subpixels R, B, W and G (e.g., unit pixel positioned at an upper side in FIG. 5) disposed in a (2i−1)th horizontal line interposed therebetween. For example, the first to fourth subpixels R, B, W and G disposed in the (2i)th horizontal line and the first to fourth subpixels R, B, W and G disposed in the (2i−1)th horizontal line can be disposed to be symmetrical to each other in a mirror shape, and the second power sharing lines VREF_H1,2 can be disposed in each of a second circuit area of the first to fourth subpixels R, B, W and G disposed in the (2i)th horizontal line and a second circuit area of the first to fourth subpixels R, B, W and G disposed in the (2i−1)th horizontal line. For example, the second power sharing line VREF_H1 can be connected to each of the sensing thin film transistors ST disposed in the second circuit area of the first to fourth subpixels R, B, W and G disposed in the (2i−1)th horizontal line, and the second power sharing line VREF_H2 can be connected to each of the sensing thin film transistors ST disposed in the second circuit area of the first to fourth subpixels R, B, W and G disposed in the (2i)th horizontal line.

The second power sharing lines VREF_H1, 2 can include a first portion extended between the first subpixel R and the second subpixel B based on the center connected with the second power line VREF and a second portion extended between the third subpixel W and the fourth subpixel G. For example, an end of the first portion of the second power sharing lines VREF_H1, 2 can be disposed between the data lines DL1 and DL2 between the first and second subpixels R and B. Further, an end of the second portion of the second power sharing lines VREF_H1, 2 can be disposed between the data lines DL3 and DL4 between the third and fourth subpixels W and G.

The four first to fourth subpixels R, B, W and G constituting one unit pixel can include second branch power patterns extended in a first direction parallel with the second power sharing lines VREF_H1, 2. For example, a second branch power pattern VREF_H br extended from the first subpixel R and a second branch power pattern VREF_H bb extended from the second subpixel B can respectively be connected to the end of the first portion of the second power sharing lines VREF_H1, 2. Further, a second branch power pattern VREF_H_bw extended from the third subpixel W and a second branch power pattern VREF_H_bg extended from the fourth subpixel G can respectively be connected to the end of the second portion of the second power sharing lines VREF_H1, 2.

Figure 6:
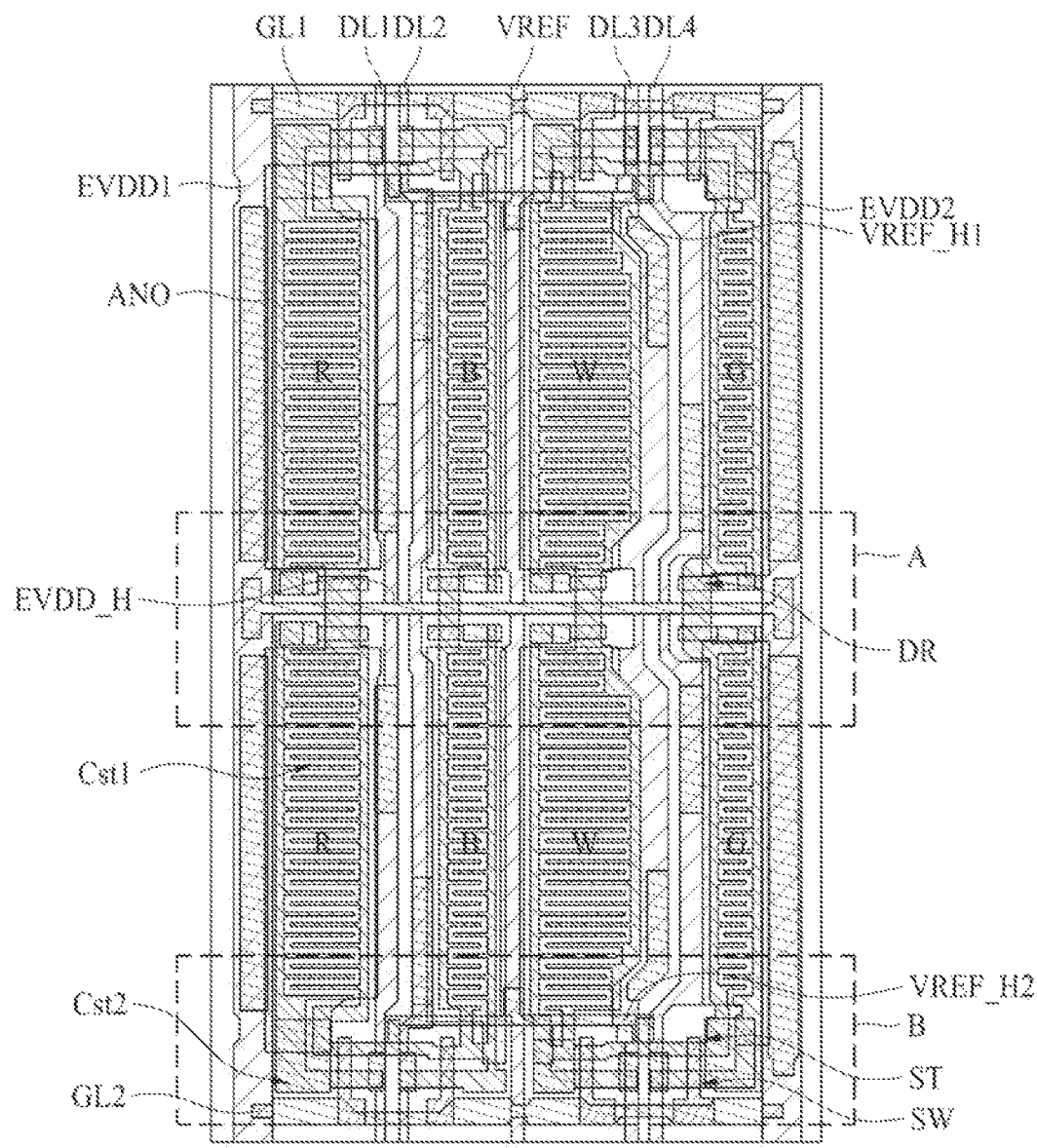
FIG. 6 is a plane view illustrating a pixel array of a display device according to various embodiments of the present disclosure.

FIG. 6 is a plane view illustrating a pixel array of a display device according to various embodiments of the present disclosure. FIG. 6 illustrates the pixel array of FIG. 5 in more detail.

Referring to FIG. 6, the display device according to various embodiments of the present disclosure can include a pixel array that includes four first to fourth subpixels R, B, W and G (e.g., unit pixel positioned at a lower side in FIG. 6) constituting one unit pixel, disposed in a (2i)th (i is a natural number) horizontal line, and four first to fourth subpixels R, B, W and G (e.g., unit pixel positioned at an upper side in FIG. 6) constituting one unit pixel, disposed in a (2i−1)th horizontal line.

The respective subpixels R, B, W and G can be defined by intersection of the gate lines GL1 and GL2 and the data lines DL1 to DL4, and can include a light emitting diode PXL, a driving thin film transistor DR, a sensing thin film transistor ST, a switching thin film transistor SW, a first storage capacitor Cst1, and a second storage capacitor Cst2.

A first electrode ANO of the light emitting diode PXL and the first storage capacitor Cst1 can be disposed in an opening area (or light emission area) of each of the subpixels R, B, W and G.

The driving thin film transistor DR can be disposed in the first circuit area disposed at one side (e.g., upper side of each subpixel of the (2i)th horizontal line in FIG. 6) of the opening area of the respective subpixels R, B, W and G disposed in the (2i)th horizontal line, and the sensing thin film transistor ST, the switching thin film transistor SW and the second storage capacitor Cst2 can be disposed in the second circuit area disposed at the other side (e.g., lower side of each subpixel of the (2i)th horizontal line in FIG. 6) of the opening area.

The respective subpixels R, B, W and G disposed in the (2i−1)th horizontal line can be disposed to be symmetrical to the respective subpixels R, B, W and G disposed in the (2i)th horizontal line in a mirror shape, and the driving thin film transistor DR can be disposed in the first circuit area disposed at one side (e.g., upper side of each subpixel of the (2i−1)th horizontal line in FIG. 6) of the opening area, and the sensing thin film transistor ST, the switching thin film transistor SW and the second storage capacitor Cst2 can be disposed in the second circuit area disposed at the other side (e.g., lower side of each subpixel of the (2i−1)th horizontal line in FIG. 6) of the opening area.

The respective subpixels R, B, W and G respectively disposed in the (2i)th horizontal line and the (2i−1)th horizontal line can be separated with a unit pixel adjacent thereto by the plurality of first power lines EVDD1 and EVDD2. For example, the plurality of power lines EVDD1 and EVDD2 can respectively be disposed at a right side of the first subpixels R and a left side of the fourth subpixels G arranged in the second direction (e.g., vertical direction). The first power sharing line EVDD_H extended in the first direction and electrically connected with each of the first power lines EVDD1 and EVDD2 of the left and right sides can be included between the plurality of first power lines EVDD1 and EVDD2. The first power sharing line EVDD_H can be formed between the plurality of first power lines EVDD1 and EVDD2 in a straight-line shape. The plurality of first power lines EVDD1 and EVDD2 can be connected to the driving thin film transistor DR disposed in the first circuit area of the first to fourth subpixels R, B, W and G through the first power sharing line EVDD_H.

The data lines DL1 to DL4 can be disposed in parallel between the first and second subpixels R and B and between the third and fourth subpixels W and G, which are arranged in the second direction. Each of the data lines DL1 to DL4 can supply the data signal to the switching thin film transistors SW disposed in the second circuit area of the subpixels R, B, W and G adjacent thereto.

The gate lines GL1 and GL2 extended along the first direction and disposed in parallel along the second direction can be disposed at the position corresponding to the second circuit area of the respective subpixels R, B, W and G respectively disposed in the (2i)th horizontal line and the (2i−1)th horizontal line.

The second power line VREF can be disposed to be parallel with the plurality of first power lines EVDD1 and EVDD2 between the second subpixels B and the third subpixels W, which are arranged in the second direction. The second power line VREF can include a second power sharing line VREF_H extended toward left and right sides in a horizontal direction. The second power sharing line VREF_H can be formed to be extended to left and right sides based on the center connected with the second power line. The second power line VREF can be connected to the sensing thin film transistors ST, which are disposed in the second circuit area of the first to fourth subpixels R, B, W and G, through the second power sharing line VREF_H.

Figure 7:
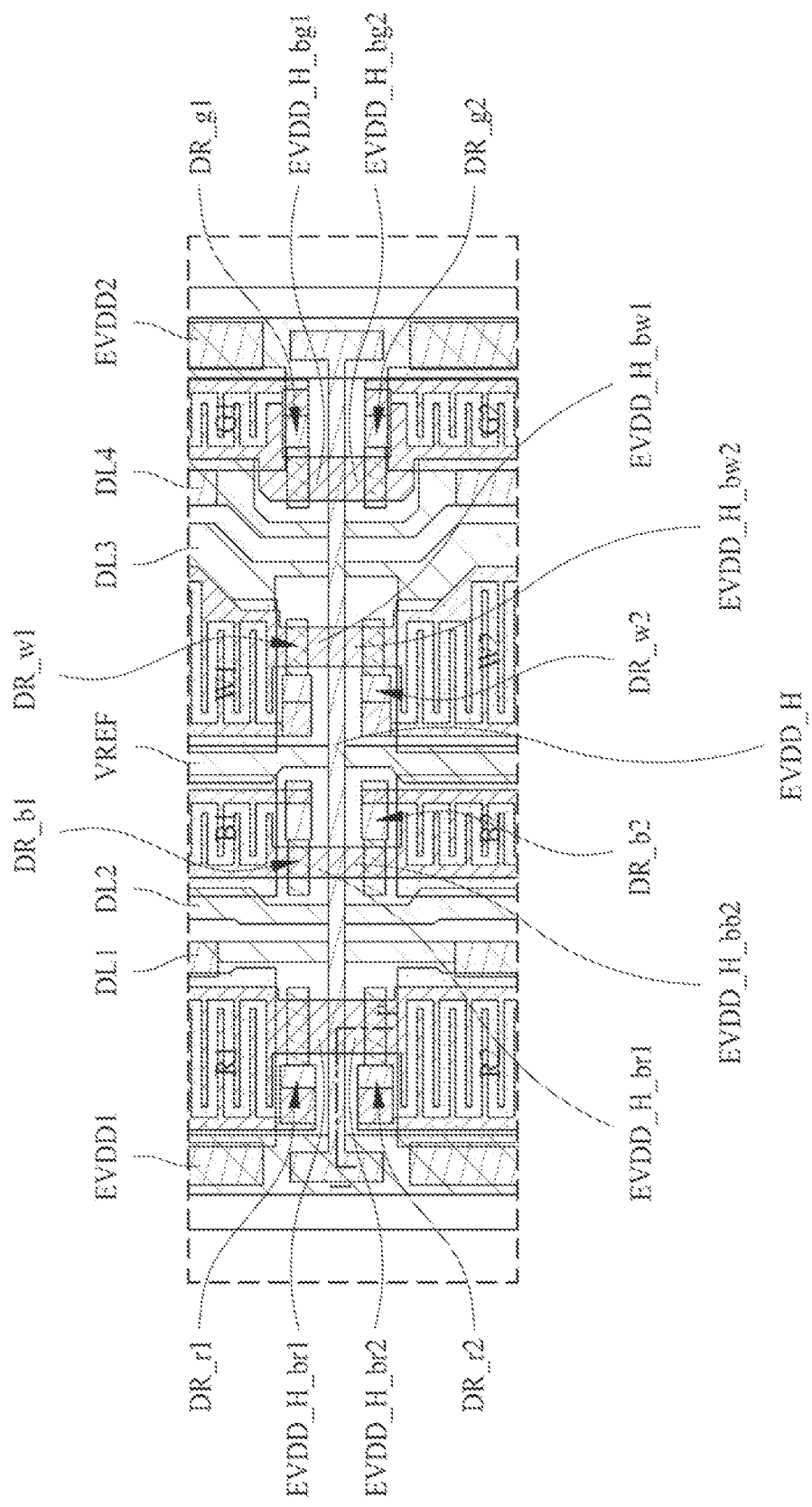
FIG. 7 is an enlarged view of a portion A of FIG. 6.
Figure 8:
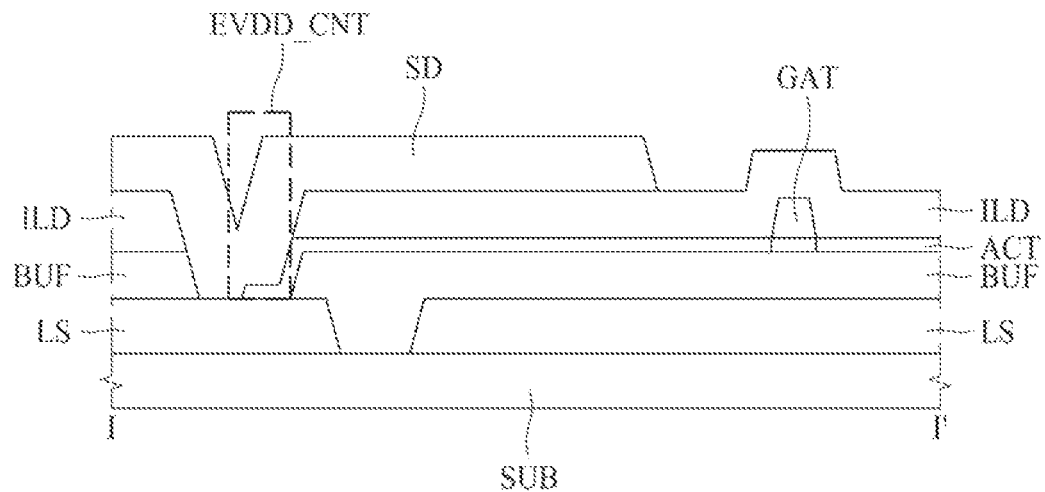
FIG. 8 is a cross-sectional view taken along line I-I' of FIG. 7.

FIG. 7 is an enlarged view of a portion A of FIG. 6. FIG. 8 is a cross-sectional view taken along line I-I' of FIG. 7.

Figure 9:
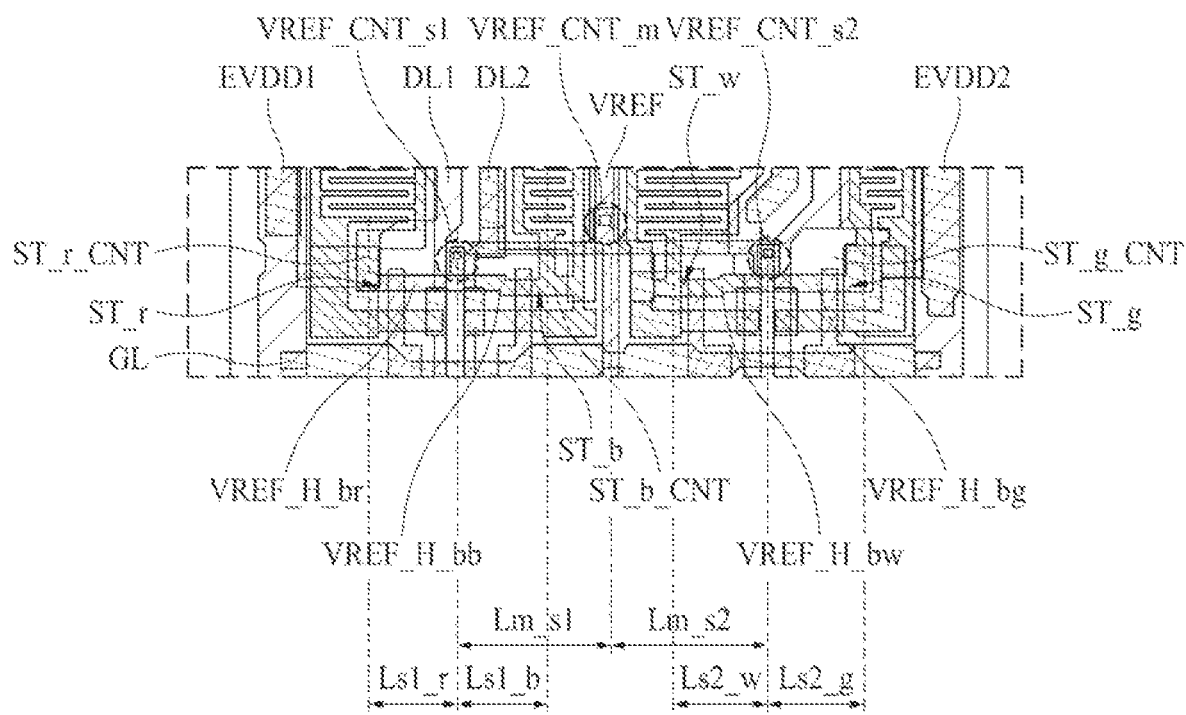
FIG. 9 is an enlarged view of a portion B of FIG. 6.

FIG. 9 is an enlarged view of a portion B of FIG. 6. These drawings are intended to specifically describe the first power sharing line EVDD_H and the second power sharing line VREF_H in the display device according to various embodiments of the present disclosure.

Referring to FIGS. 7 and 8 in connection with FIG. 6, the first power sharing line EVDD_H in the display device according to various embodiments of the present disclosure will be described as follows.

As shown in FIG. 7, the first power sharing line EVDD_H can be disposed between respective subpixels R1, B1, W1 and G1 respectively disposed in the (2i−1)th horizontal line and respective subpixels R2, B2, W2 and G2 respectively disposed in the (2i)th horizontal line. The first power sharing line EVDD_H can be formed between the plurality of first power lines EVDD1 and EVDD2 in a straight-line shape. For example, the first to fourth subpixels R1, B1, W1 and G1 disposed in the (2i−1)th horizontal line and the first to fourth subpixels R2, B2, W2 and G2 disposed in the (2i)th horizontal line can be disposed to be symmetrical to each other in a mirror shape, and a first circuit area of the first to fourth subpixels R1, B1, W1 and G1 disposed in the (2i−1)th horizontal line and a first circuit area of the first to fourth subpixels R2, B2, W2 and G2 disposed in the (2i)th horizontal line can be disposed to be adjacent to each other with the first power sharing line EVDD_H interposed therebetween.

The first power sharing line EVDD_H can commonly be connected to each of the first to fourth subpixels R1, B1, W1 and G1 disposed in the (2i−1)th horizontal line and the first to fourth subpixels R2, B2, W2 and G2 disposed in the (2i)th horizontal line. For example, the first power sharing line EVDD_H can be connected to each of the driving thin film transistors DR disposed in the first circuit area of the first to fourth subpixels R1, B1, W1 and G1 disposed in the (2i−1)th horizontal line and connected to each of the driving thin film transistors DR disposed in the first circuit area of the first to fourth subpixels R2, B2, W2 and G2 disposed in the (2i)th horizontal line.

The first to fourth subpixels R1, B1, W1 and G1 disposed in the (2i−1)th horizontal line and the first to fourth subpixels R2, B2, W2 and G2 disposed in the (2i)th horizontal line can include first branch power patterns extended in a second direction oriented toward the first power sharing line EVDD_H. For example, first branch power patterns EVDD_H_br1 and EVDD_H_br2 extended from driving thin film transistors DR_r1 and DR_r2 of the first subpixels R1 and R2 can be connected to the first power sharing line EVDD_H, first branch power patterns EVDD_H_bb1 and EVDD_H_bb2 extended from driving thin film transistors DR_b1 and DR_b2 of the second subpixels B1 and B2 can be connected to the first power sharing line EVDD_H, first branch power patterns EVDD_H_bw1 and EVDD_H_bw2 extended from driving thin film transistors DR_w1 and DR_w2 of the third subpixels W1 and W2 can be connected to the first power sharing line EVDD_H, and first branch power patterns EVDD_H_bg1 and EVDD_H_bg2 extended from driving thin film transistors DR_g1 and DR_g2 of the fourth subpixels G1 and G2 can be connected to the first power sharing line EVDD_H.

The first branch power patterns can be formed as an active layer of the driving thin film transistor DR. For example, the active layer can be conductorized to serve as the first branch power pattern. Further, the active layer can include a common active layer commonly connected with one side of each of the first branch power patterns and formed to partially overlap the first power line EVDD while overlapping the first power sharing line EVDD_H.

As shown in FIG. 8, a light-shielding layer LS, a buffer layer BUF, an active layer ACT, a gate electrode GAT, an inter-layer dielectric film ILD, and a source/drain electrode SD can be disposed on a substrate SUB.

The active layer ACT of the driving thin film transistor DR can be extended to partially overlap the light-shielding layer LS while overlapping the source/drain electrode SD, and a contact area EVDD_CNT can be formed in a portion where the light-shielding layer LS, the active layer ACT and the source/drain electrode SD are all overlapped with one another, with the active layer ACT interposed between the light-shielding layer LS and the source/drain electrode SD. The active layer ACT extended to the source/drain electrode SD on the plane can be the first branch power pattern, the portion where the source/drain electrode SD is overlapped with the active layer ACT can be the first power sharing line EVDD_H, and the portion where the light-shielding layer LS is overlapped with the source/drain electrode SD can be the first power line EVDD.

In the display device according to various embodiments of the present disclosure, the active layer ACT of the driving thin film transistor DR can be extended to partially overlap the first power line EVDD while overlapping the first power sharing line EVDD_H, and a contact area EVDD_CNT where the light-shielding layer LS, the active layer ACT and the source/drain electrode SD directly contact one another can be formed within the first power line EVDD, whereby the number of contact holes for supplying a power voltage to the driving thin film transistor DR can be reduced to one. Further, the first power sharing line EVDD_H can be formed of a dual line of the active layer ACT and the source/drain electrode SD, whereby resistance load can be reduced.

Next, with reference to FIG. 9 in connection with FIG. 6, the second power sharing line VREF_H in another display device according to various embodiments of the present disclosure will be described as follows.

As shown in FIG. 9, the second power line VREF can be disposed between the plurality of first power lines EVDD1 and EVDD2 and extended along the second direction. For example, the second power line VREF can be disposed to be parallel with the plurality of first power lines EVDD1 and EVDD2 between the second subpixels B and the third subpixels W. The second power line VREF can include a second power sharing line VREF_H extended toward left and right sides in a horizontal direction. The second power sharing line VREF_H can be formed to be extended to left and right sides based on the center connected with the second power line. The second power line VREF can be connected to the sensing thin film transistors ST, which are disposed in the second circuit area of the first to fourth subpixels R, B, W and G, through the second power sharing line VREF_H.

The second power sharing line VREF_H can include a first portion connected with the second power line VREF at a center portion through a main contact hole VREF_CNT_m and extended between the first subpixel R and the second subpixel B based on the main contact hole VREF_CNT_m, and a second portion extended between the third subpixel W and the fourth subpixel G. For example, an end of the first portion of the second power sharing line VREF_H can be disposed between the data lines DL1 and DL2 between the first and second subpixels R and B. Also, an end of the second portion of the second power sharing line VREF_H may be disposed between the data lines DL3 and DL4 between the third and fourth subpixels W and G. Second branch power patterns VREF_H_br and VREF_H_bb extended from each of the sensing thin film transistor ST_r of the first subpixel R and the sensing thin film transistor ST_b of the second subpixel B can be connected through a first sub contact hole VREF_CNT_s1 at the end of the first portion of the second power sharing line VREF_H. Further, second branch power patterns VREF_H_bw and VREF_H_bg extended from each of the sensing thin film transistor ST_w of the third subpixel W and the sensing thin film transistor ST_g of the fourth subpixel G can be connected through a second sub contact hole VREF_CNT_s2 at the end of the second portion of the second power sharing line VREF_H.

In the display device according to various embodiments of the present disclosure, the respective subpixels R, B, W and G can have the same electrical distance from the center of the second power sharing line VREF_H connected with the second power line VREF. For example, an electrical distance associated with the first subpixel R is a sum of an electrical distance Lm_s1 between the main contact hole VREF_CNT_m and a first sub contact hole VREF_CNT_s1 and an electrical distance Ls1_$r$ between the first sub contact hole VREF_CNT_s1 and the first subpixel R, an electrical distance associated with the second subpixel B is a sum of the electrical distance Lm_s1 between the main contact hole VREF_CNT_m and the first sub contact hole VREF_CNT_s1 and an electrical distance Ls1_$b$ between the first sub contact hole VREF_CNT_s1 and the second subpixel B, an electrical distance associated with the third subpixel W is a sum of an electrical distance Lm_s2 between the main contact hole VREF_CNT_m and a second sub contact hole VREF_CNT_s2 and an electrical distance Ls2_$w$ between the second sub contact hole VREF_CNT_s2 and the third subpixel W, an electrical distance associated with the fourth subpixel G is a sum of the electrical distance Lm_s2 between the main contact hole VREF_CNT_m and the second sub contact hole VREF_CNT_s2 and an electrical distance Ls2_$g$ between the second sub contact hole VREF_CNT_s2 and the fourth subpixel G. As such, the respective subpixels R, B, W and G can have the same electrical distance. In this case, load deviation of the sensing lines of the respective subpixels can be reduced.

Figure 10:
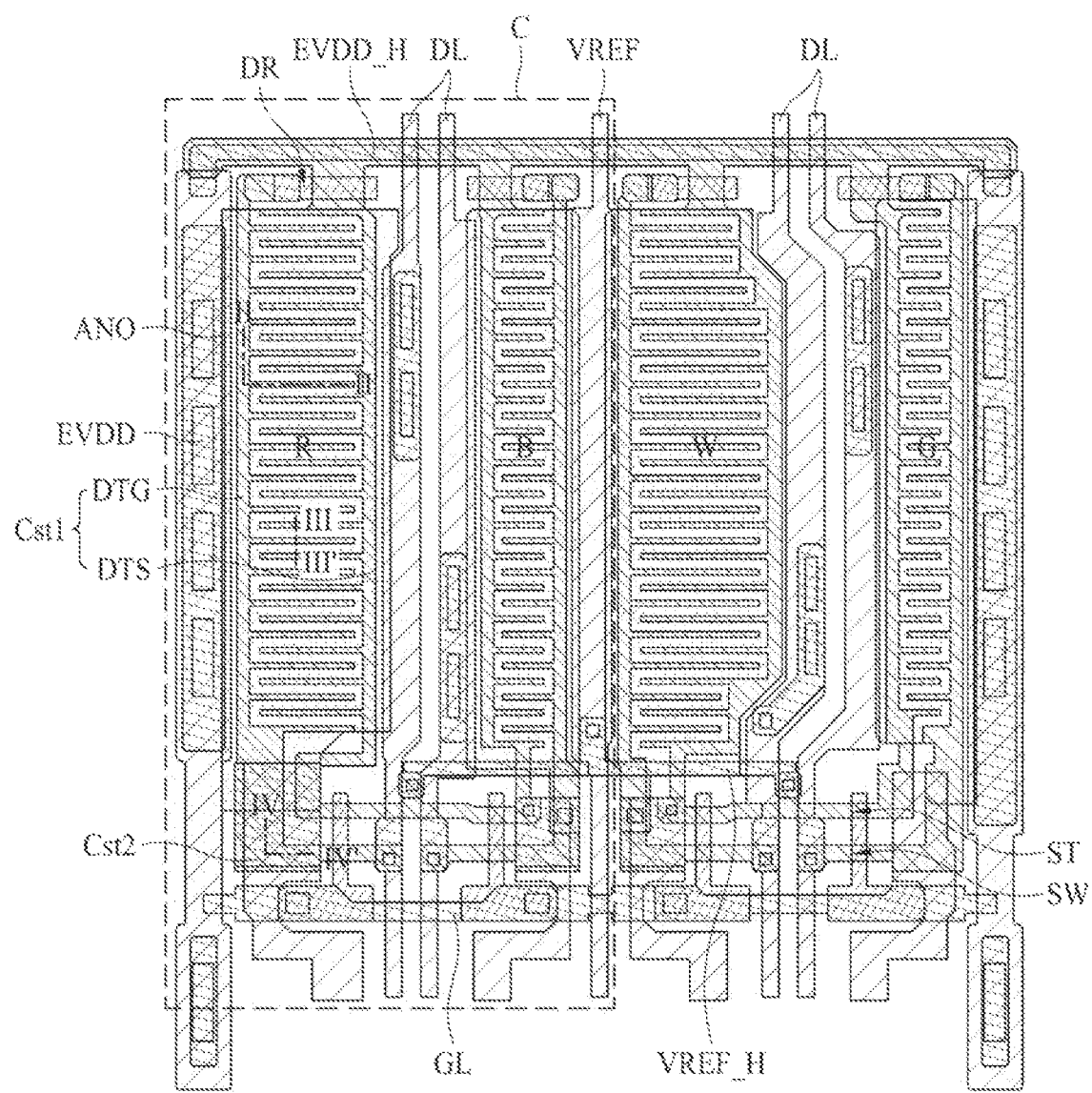
FIG. 10 is a schematic plane view illustrating a unit pixel of a display device according to various embodiments of the present disclosure.
Figure 11:
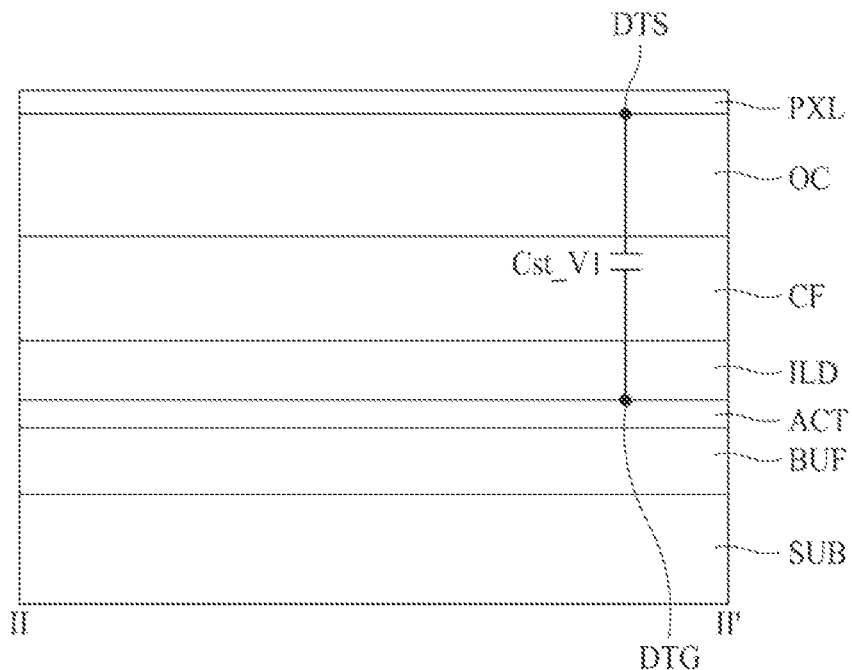
FIG. 11 is a cross-sectional view taken along line II-II' of FIG. 10.
Figure 12:
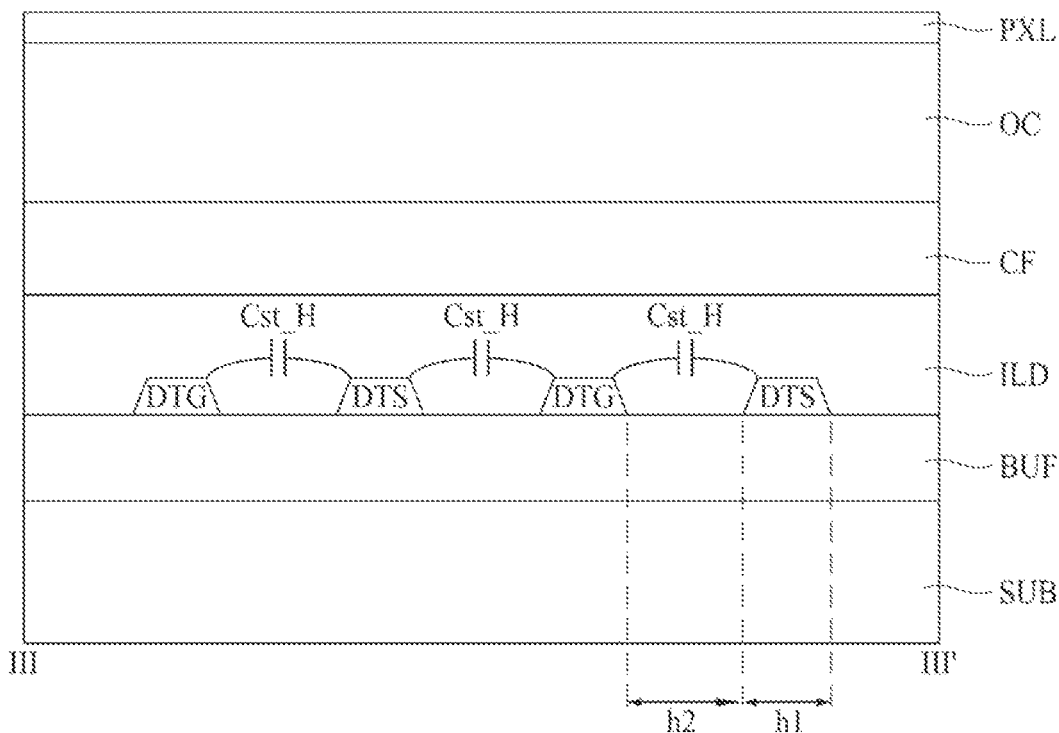
FIG. 12 is a cross-sectional view taken along line III-III' of FIG. 10.
Figure 13:
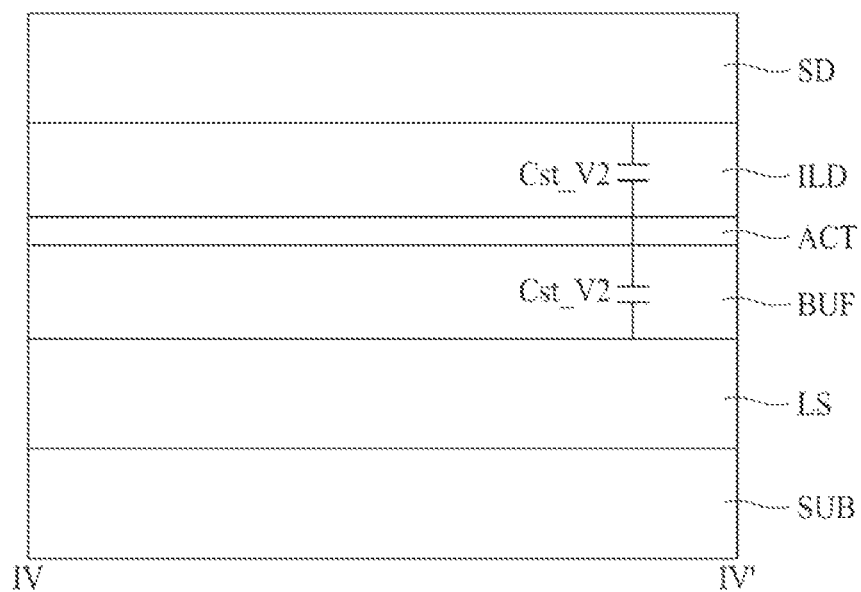
FIG. 13 is a cross-sectional view taken along line IV-IV' of FIG. 10.
Figure 14:
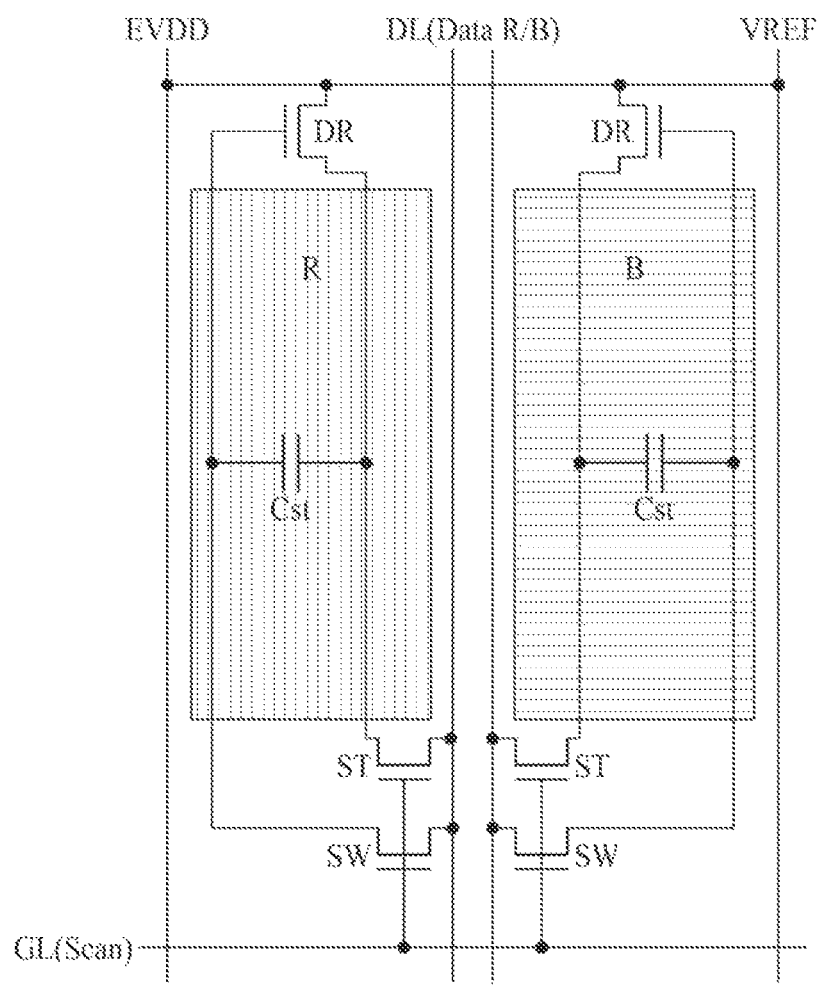
FIG. 14 is an equivalent circuit view illustrating a storage capacitor of subpixels of a portion C of FIG. 10.

FIG. 10 is a schematic plane view illustrating a unit pixel of a display device according to various embodiments of the present disclosure. FIG. 11 is a cross-sectional view taken along line II-II' of FIG. 10. FIG. 12 is a cross-sectional view taken along line III-III' of FIG. 10. FIG. 13 is a cross-sectional view taken along line IV-IV' of FIG. 10. FIG. 14 is an equivalent circuit view illustrating a storage capacitor of subpixels of a portion C of FIG. 10. These drawings are intended to specifically describe the storage capacitor Cst in the display device according to various embodiments of the present disclosure. Therefore, in the following description, a repeated description of the other same elements except the description of the storage capacitor Cst will be omitted or may be briefly described.

As shown in FIG. 10, the respective subpixels R, B, W and G can be defined by intersection between the gate lines GL and the data lines DL, and can include a light emitting diode PXL, a driving thin film transistor DR, a sensing thin film transistor ST, a switching thin film transistor ST, a first storage capacitor Cst1, and a second storage capacitor Cst2.

A first electrode ANO of the light emitting diode PXL and the first storage capacitor Cst1 can be disposed in an opening area (or light emission area).

The driving thin film transistor DR can be disposed in the first circuit area disposed at one side (e.g., upper side of the opening area) of the opening area, and the second storage capacitor Cst2 can be disposed in the second circuit area disposed at the other side (e.g., lower side of the opening area) of the opening area.

As shown in FIG. 11, in the opening area of each of the subpixels R, B, W and G, a buffer layer BUF, an active layer ACT, an inter-layer dielectric film ILD, a color filter CF, an over coat layer OC and a light emitting diode PXL can be disposed on a substrate SUB.

The buffer layer BUF can be formed on an entire surface of the substrate SUB, and the active layer ACT on the buffer layer BUF can be connected to any one of the gate electrode and the source electrode of the driving thin film transistor DR. For example, in FIG. 11, the active layer ACT can be the first electrode pattern DTG conductorized by being connected to the gate electrode of the driving thin film transistor DR. Alternatively, the active layer ACT can be the second electrode pattern DTS conductorized by being connected to the source electrode of the driving thin film transistor DR.

The inter-layer dielectric film ILD, the color filter CF, the overcoat layer OC, and the light emitting diode PXL can be formed on the active layer ACT.

The first electrode pattern DTG formed by conductorization of the active layer ACT and the first electrode ANO of the light emitting diode PXL can be spaced apart from each other by interposing the inter-layer dielectric film ILD, the color filter CF, and the overcoat layer OC, whereby a vertical capacitor Cst_V1 can be formed in a vertical direction. Alternatively, the vertical capacitor Cst_V1 can be formed in a vertical direction between the second electrode pattern DTS formed by conductorization of the active layer ACT and the first electrode ANO of the light emitting diode PXL.

As shown in FIG. 12, in the opening area of each of the subpixels R, B, W and G, the buffer layer BUF, the active layer ACT, the inter-layer dielectric film ILD, the color filter CF, the overcoat layer OC and the light emitting diode PXL can be disposed on the substrate SUB.

The buffer layer BUF can be formed on the entire surface of the substrate SUB, and the active layer ACT on the buffer layer BUF can be connected to any one of the gate electrode and the source electrode of the driving thin film transistor DR. For example, in FIG. 12, the active layer ACT can be a finger pattern structure in which each of a plurality of first electrode patterns DTG conductorized by being connected to the gate electrode of the driving thin film transistor DR and each of a plurality of second electrode patterns DTS conductorized by being connected to the source electrode of the driving thin film transistor DR are disposed on the same plane in parallel. A width h1 of each of the plurality of first and second electrode patterns DTG and DTS can be smaller than a width h2 between the first and second electrode patterns DTG and DTS.

The plurality of first electrode patterns DTG and the plurality of second electrode patterns DTS, which are formed by conductorization of the active layer ACT, can be disposed alternately, whereby a horizontal capacitor Cst_H can be formed in a horizontal direction between the first and second electrode patterns.

Referring to FIGS. 11 and 12, a first storage capacitor Cst1, which includes the vertical capacitor Cst_V1 shown in FIG. 11 and the horizontal capacitor Cst_H shown in FIG. 12, can be formed in the opening area of each of the subpixels R, B, W and G. For example, based on the red subpixel R, the first storage capacitor Cst1 of the opening area can be a capacitor in which the vertical capacitor Cst_V1 and the horizontal capacitor Cst_H are combined with each other.

As shown in FIG. 13, in the second circuit area of each of the subpixels R, B, W and G, the light-shielding layer LS, the buffer layer BUF, the active layer ACT, the inter-layer dielectric film ILD and the source/drain electrode SD can be disposed on the substrate SUB.

The light-shielding layer LS can be disposed on the substrate SUB to overlap the active layer ACT and the source/drain electrode SD. The active layer ACT on the buffer layer BUF can be connected to any one of the gate electrode and the source electrode of the driving thin film transistor DR. For example, in FIG. 13, the active layer ACT can be the first electrode pattern DTG conductorized by being connected to the gate electrode of the driving thin film transistor DR. Alternatively, the active layer ACT can be the second electrode pattern DTS conductorized by being connected to the source electrode of the driving thin film transistor DR.

The inter-layer dielectric film ILD and the source/drain electrode SD can be formed on the active layer ACT. For example, the light-shielding layer LS can be disposed below the active layer ACT with the buffer layer BUF interposed therebetween, and the source/drain electrode SD can be disposed above the active layer ACT with the inter-layer dielectric film ILD interposed therebetween.

In the first electrode pattern DTG formed by conductorization of the active layer ACT, dual vertical capacitors Cst_V2 can be formed in a vertical direction to each of the light-shielding layer LS therebelow and the source/drain electrode SD thereabove by being spaced apart from the light-shielding layer LS by interposing the buffer layer BUF and being spaced apart from the source/drain electrode SD by interposing the inter-layer dielectric film ILD.

Referring to FIG. 14, in the display device according to various embodiments of the present disclosure, the storage capacitor Cst can be overlapped with the opening areas of the subpixels R and B and formed between the driving thin film transistor DR of the first circuit area and the sensing thin film transistor ST of the second circuit area. For example, based on the red subpixel R, the capacitor, in which the vertical storage capacitor Cst_V1 and the horizontal capacitor Cst_H corresponding to the first storage capacitors Cst1 of the opening area are combined with each other, and the dual vertical capacitors Cst_V2 of a non-opening area (or the second circuit area) can be combined with each other to form the storage capacitor Cst.

FIGS. 15 to 19 are plane views illustrating a single layer structure of a portion of a unit pixel of a display device according to various embodiments of the present disclosure.

Referring to FIGS. 15 to 19, subpixels constituting a unit pixel in the display device according to various embodiments of the present disclosure will be described in more detail.

Figure 15:
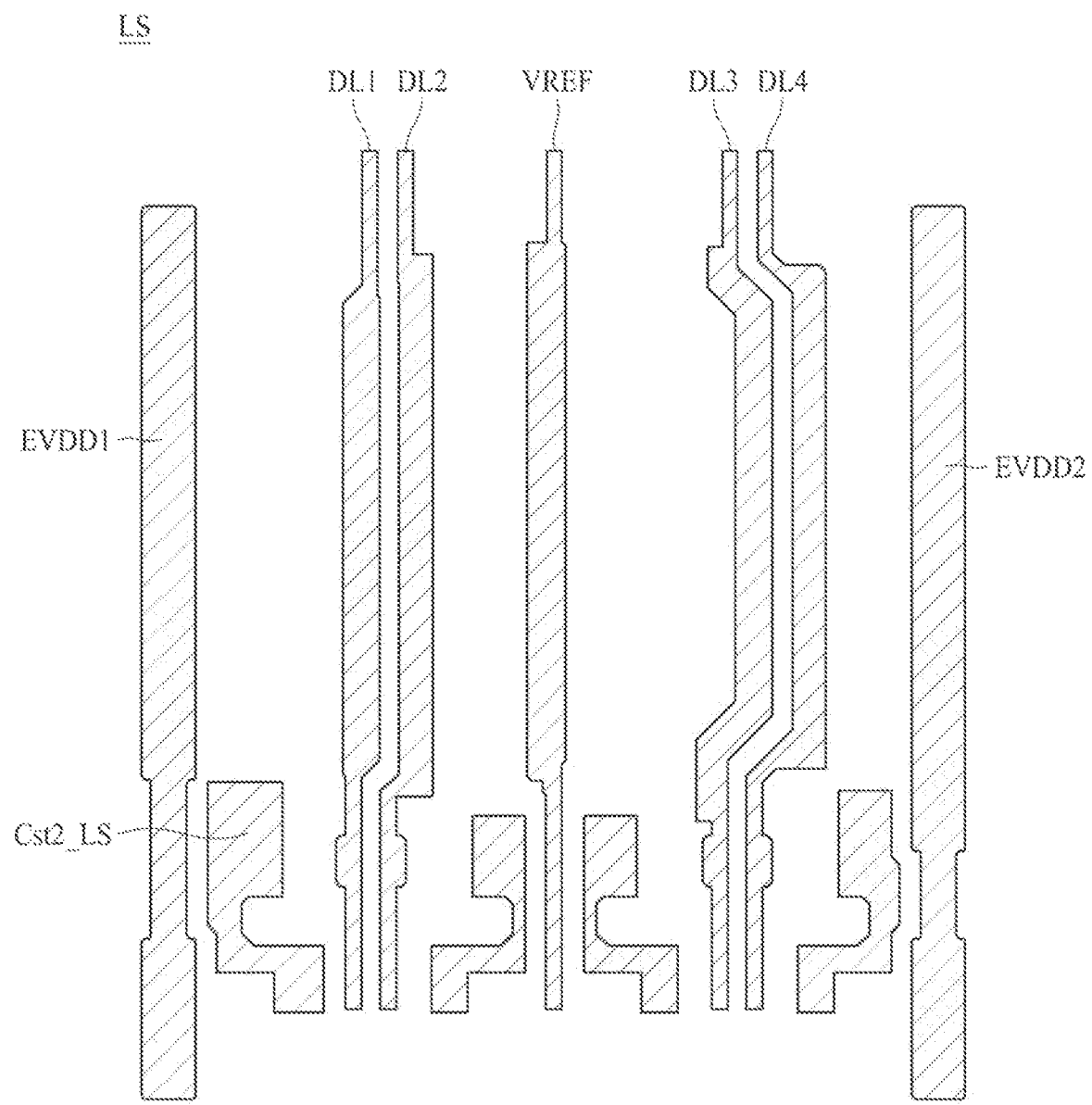
FIGS. 15 to 19 are plane views illustrating a single layer structure of a portion of a unit pixel shown in FIG. 5.

As shown in FIG. 15, a plurality of first power lines EVDD1 and EVDD2 arranged in parallel with each other along a first direction (for example, horizontal direction) and extended in a second direction (for example, vertical direction) crossing the first direction, first and second data lines DL1 and DL2 and third and fourth data lines DL3 and DL4 disposed to be adjacent to each other in parallel with the plurality of first power lines EVDD1 and EVDD2 between the first power lines EVDD1 and EVDD2, and a second power line VREF disposed to be parallel with the second and third data lines DL2 and DL3 between the second and third data lines DL2 and DL3 can be formed on the substrate. The plurality of first power lines EVDD1 and EVDD2, the data lines DL1 to DL4 and the second power line VREF can be formed by the light-shielding layer LS.

A light-shielding pattern Cst2_LS corresponding to the sensing thin film transistor ST and the switching thin film transistor SW formed in the second circuit areas of the first to fourth subpixels R, B, W and G and forming the second storage capacitor Cst2 can be disposed.

The buffer layer BUF can be disposed on the substrate, on which the elements shown in FIG. 15 are formed, to cover the elements. The buffer layer BUF can serve to protect the thin film transistor formed by a subsequent process from impurities such as alkali ion leaking from the light-shielding layer LS or the substrate. The buffer layer BUF can be a silicon oxide (SiOx), a silicon nitride (SiNx) or a multi-layer of SiOx and SiNx.

Figure 16:
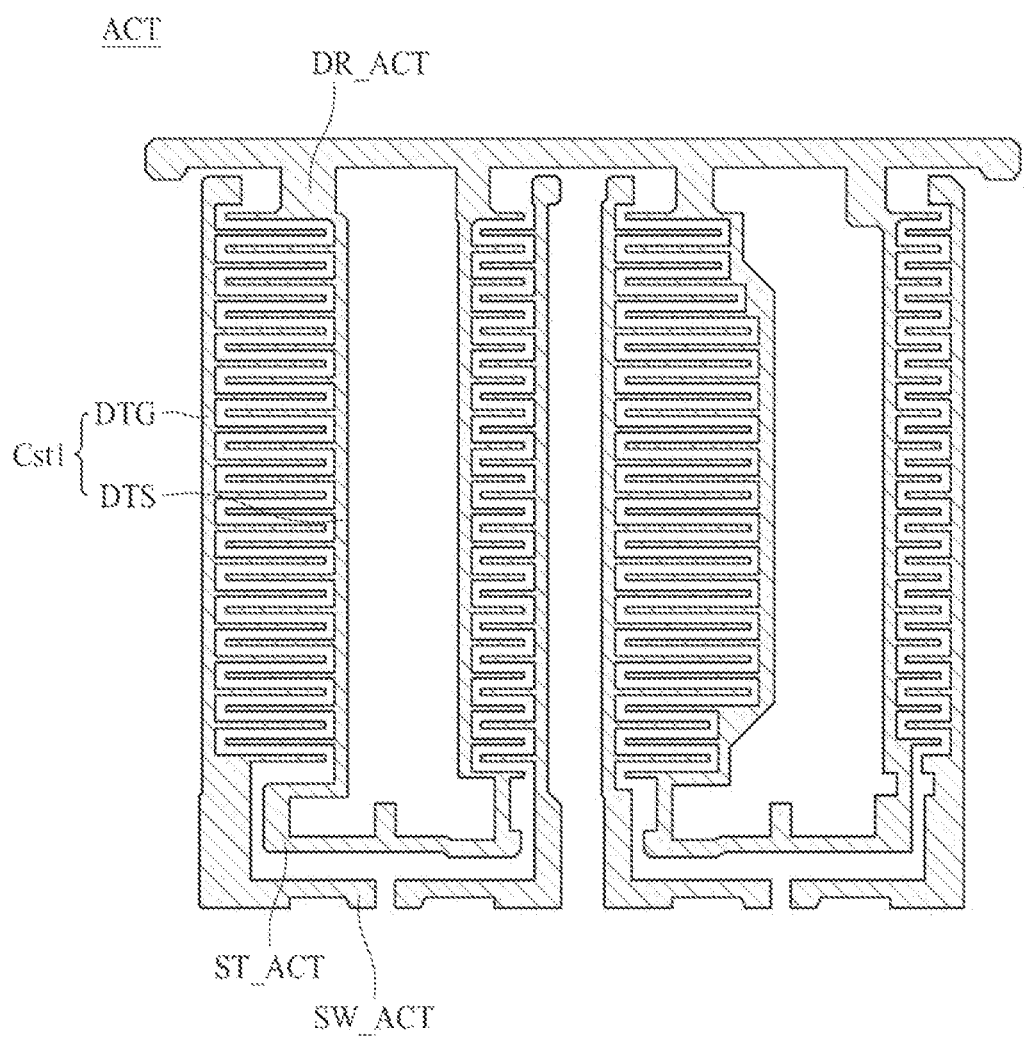

As shown in FIG. 16, the active layer ACT can be disposed on the buffer layer BUF.

The active layer ACT can include an active layer DR_ACT of the driving thin film transistor DR disposed in first circuit areas RC1, BC1, WC1 and GC1 of the respective subpixels R, B, W and G, an active layer ST_ACT of the sensing thin film transistor ST disposed in second circuit areas RC2, BC2, WC2 and GC2, and an active layer SW_ACT of the switching thin film transistor SW. Further, the active layer ACT can include an active layer constituting a first electrode pattern DTG and a second electrode pattern DTS, which are disposed in the opening areas of the respective subpixels R, B, W and G. In the active layer ACT, a portion connected with the gate electrode of the driving thin film transistor DR of the first circuit area, a portion constituting the first electrode pattern DTG in the opening area, and a portion constituting the switching thin film transistor SW of the second circuit area can be formed in a single body. Further, in the active layer ACT, a portion connected with the source electrode of the driving thin film transistor DR of the first circuit area, a portion constituting the second electrode pattern DTS in the opening area, and a portion constituting the sensing thin film transistor ST of the second circuit area can be formed in a single body. Further, the active layer ACT can include a common active layer formed to partially overlap the first power lines EVDD1 and EVDD2 while overlapping the first power sharing line EVDD_H which will be formed between the first power lines EVDD1 and EVDD2.

Each of the first electrode pattern DTG and the second electrode pattern DTS of the active layer ACT in the opening area can be formed to be commonly connected to a first common pattern and a second common pattern, and disposed in parallel in a finger pattern structure.

Figure 17:
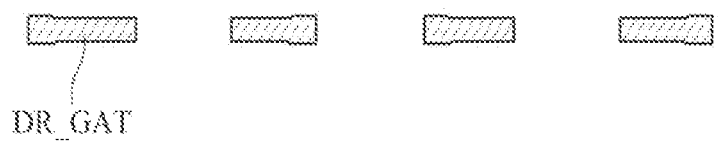
Figure 17:

As shown in FIG. 17, a gate electrode DR_GAT for constituting the driving thin film transistor DR can be formed in the first circuit areas of the first to fourth subpixels R, B, W and G, and a gate electrode ST_GAT for constituting the sensing thin film transistor ST and a gate electrode SW_GAT for constituting the switching thin film transistor SW can be disposed in the second circuit areas. The gate electrode ST_GAT of the sensing thin film transistor ST and the gate electrode SW_GAT of the switching thin film transistor SW can be formed in a single body.

The inter-layer dielectric film ILD can be disposed on the substrate on which the elements shown in FIG. 17, to cover the elements. The inter-layer dielectric film ILD can be a silicon oxide (SiOx), a silicon nitride (SiNx) or a multi-layer of SiOx and SiNx.

Figure 18:
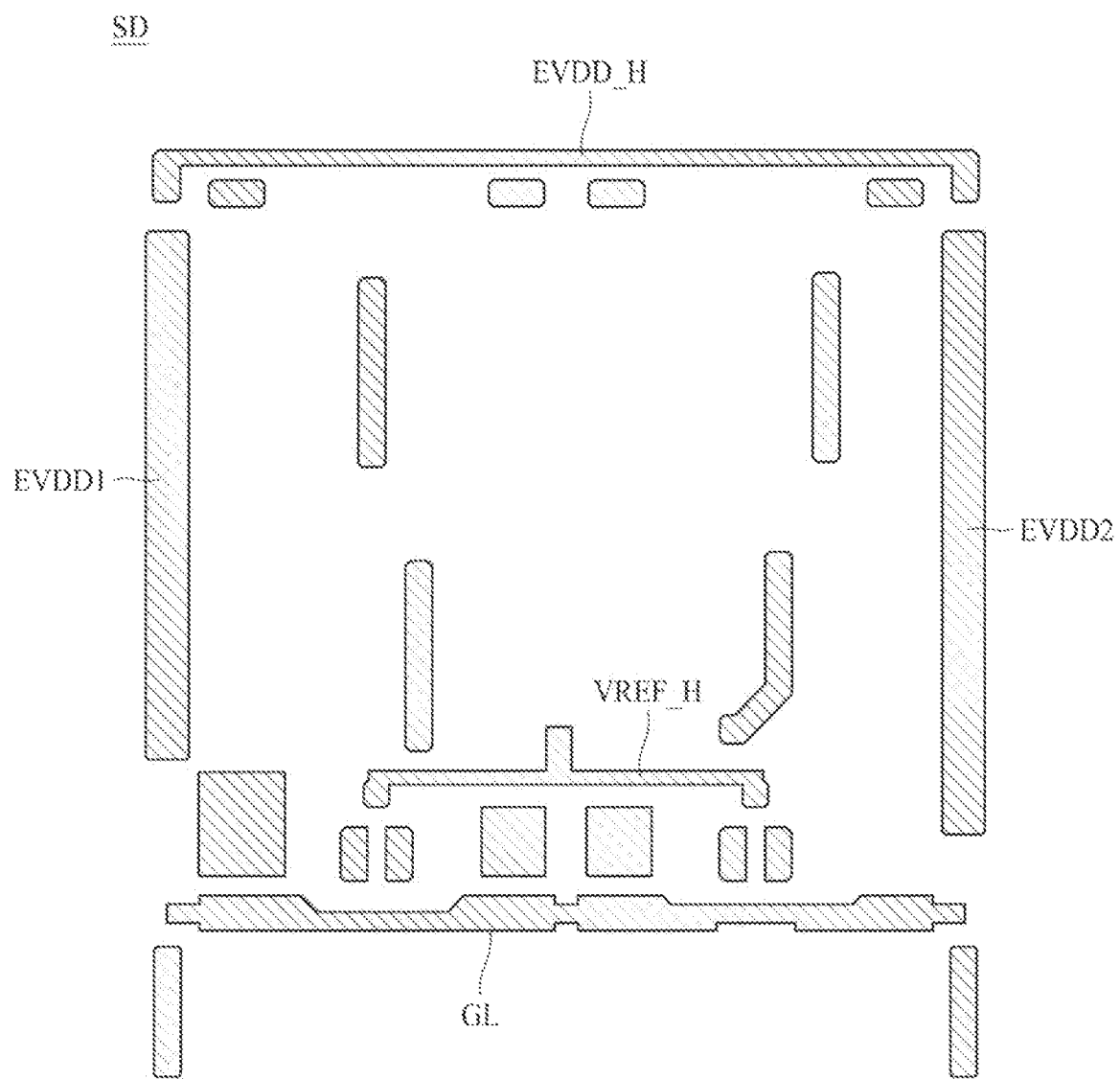

As shown in FIG. 18, the plurality of first power lines EVDD1 and EVDD2, the first power sharing line EVDD_H, the second power sharing line VREF_H, and the gate line GL can be formed on the inter-layer dielectric film ILD. Further, the source/drain electrode SD of the driving thin film transistor DR formed in the first circuit areas of the first to fourth subpixels R, B, W and G and the source/drain electrodes SD of the sensing thin film transistor ST and the switching thin film transistor SW formed in the second circuit areas can be formed. For example, each of the plurality of first power lines EVDD1 and EVDD2 can be formed of a dual line of the light-shielding layer LS and the source/drain electrode SD, whereby resistance load can be reduced.

The elements shown in FIG. 18 can be formed of the same material, and can be a multi-layer made of any one selected from a group of Mo, Al, Cr, Au, Ti, Ni, Nd and Cu, or their alloy. For example, the elements can be made of a double layer of Cu/MoTi.

Also, a passivation film PAS may be disposed to cover all of the elements shown in FIG. 18. The passivation film PAS is an insulating film for protecting elements therebelow, and can be a silicon oxide (SiOx), a silicon nitride (SiNx) or a multi-layer of SiOx and SiNx.

Red, blue, white and green color filters CF can be disposed on the passivation film PAS to correspond to the opening areas of the respective subpixels R, B, W and G. The color filters CF can emit light of red, blue, white and green colors by passing through white light emitted from the light emitting diode PXL.

The overcoat layer OC can be disposed on the color filters CF to cover the color filters CF. The overcoat layer OC can be a planarization film that mitigates a step difference of a lower structure.

Figure 19:
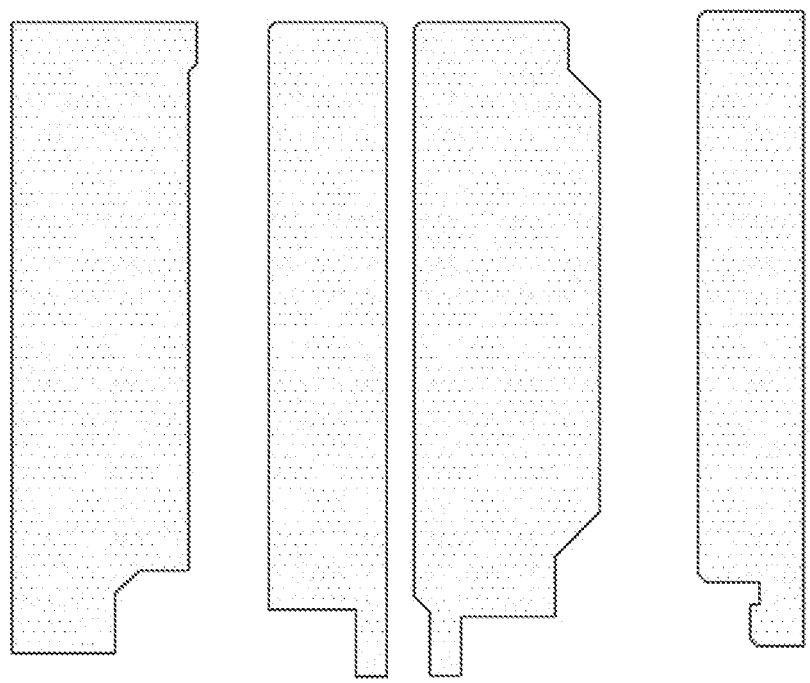

As shown in FIG. 19, the light emitting diodes PXL can be disposed on the overcoat layer OC to correspond to the opening area of each of the subpixels R, B, W and G. The light emitting diodes PXL can include a first electrode (e.g., anode electrode ANO), a light emitting layer, and a second electrode (e.g., cathode electrode). For example, the light emitting diode PXL can be an organic light emitting diode (OLED).

The display device according to various embodiments of the present disclosure can be described as follows.

The display device according to various embodiments of the present disclosure can include a first power sharing line disposed to be parallel with a first direction, first and second pixels disposed along a second direction crossing the first direction with the first power sharing line interposed therebetween, and a second power sharing line disposed to be parallel with the first power sharing line with any one of the first and second pixels interposed therebetween.

In the display device according to various embodiments of the present disclosure, each of the first and second pixels can include an opening area and first and second circuit areas respectively disposed at both sides of the opening area in the second direction, and the first power sharing line can be disposed to be adjacent to the first circuit area of each of the first and second pixels, and the second power sharing line can be disposed to be adjacent to the second circuit area of any one of the first and second pixels.

In the display device according to various embodiments of the present disclosure, in a plan view, the first and second pixel can be disposed to be symmetrical to each other in a mirror shape.

In the display device according to various embodiments of the present disclosure, the first power sharing line can be connected to each of the first and second pixels.

The display device according to various embodiments of the present disclosure can include a plurality of first power lines disposed to be parallel with the second direction with the first and second pixels interposed therebetween, wherein the first power sharing line can be disposed between the plurality of first power lines and connected to each of the plurality of first power lines.

In the display device according to various embodiments of the present disclosure, the first power sharing line can be formed between the plurality of first power lines in a straight-line shape.

The display device according to various embodiments of the present disclosure can include a second power line disposed in the first and second pixels in parallel with the second direction, wherein the second power sharing line can be formed to be extended to both sides based on a center connected with the second power line.

In the display device according to various embodiments of the present disclosure, each of the first and second pixels can include a plurality of subpixels arranged along the first direction, the first power sharing line can be connected to each of the plurality of subpixels included in each of the first and second pixels, and the second power sharing line can be connected to each of the plurality of subpixels included in any one of the first and second pixels.

In the display device according to various embodiments of the present disclosure, the first power sharing line can be connected to a first branch power pattern extended from each of the plurality of subpixels.

In the display device according to various embodiments of the present disclosure, active layer can be included in each of the plurality of subpixels, and the first branch power pattern can be made of the same material as that of the active layer and formed to be extended from the active layer of each of the plurality of subpixels in a second direction oriented toward the first power sharing line.

In the display device according to various embodiments of the present disclosure, the active layer can be formed to partially overlap the first power line while overlapping the first power sharing line.

In the display device according to various embodiments of the present disclosure, the first power sharing line can be formed of a dual line of the active layer and a source/drain electrode disposed over the active layer, and the first power line can be formed of a dual line of the active layer and a light-shielding layer disposed below the active layer.

In the display device according to various embodiments of the present disclosure, a contact area where the light-shielding layer, the active layer and the source/drain electrode directly contact one another can be formed within the first power line.

In the display device according to various embodiments of the present disclosure, the second power sharing line can be connected to a second branch power pattern extended from each of the plurality of subpixels.

In the display device according to various embodiments of the present disclosure, an active layer can be included in each of the plurality of subpixels, and the second branch power pattern can be made of the same material as that of the active layer and formed to be extended from the active layer of each of the plurality of subpixels to a first direction parallel with the second power sharing line.

In the display device according to various embodiments of the present disclosure, the active layer can be formed to be connected to both ends of the second power sharing line.

In the display device according to various embodiments of the present disclosure, each of the plurality of subpixels can include first, second, third and fourth subpixels sequentially arranged along the first direction, a plurality of first power lines disposed to be parallel with the second direction at each of a left side of the first subpixel and a right side of the fourth subpixel, and a second power line disposed to be parallel with the first power line between the second subpixel and the third subpixel.

In the display device according to various embodiments of the present disclosure, the first power sharing line can be disposed between the plurality of first power lines and connected to each of the plurality of first power lines, and can be connected to each of first branch power patterns respectively extended from the first to fourth subpixels.

In the display device according to various embodiments of the present disclosure, the second power sharing line can include a first portion extended between the first subpixel and the second subpixel based on the center connected with the second power line, and a second portion extended between the third subpixel and the fourth subpixel, second branch power patterns respectively extended from the first and second subpixels can respectively be connected to the first portion, and second branch power patterns respectively extended from the third and fourth subpixels can respectively be connected to the second portion.

In the display device according to various embodiments of the present disclosure, the first to fourth subpixels can have the same electrical distance from the second power sharing line connected with the second power line.

The display device according to various embodiments of the present disclosure can include a plurality of pixels having a plurality of subpixels arranged along a first direction and a second direction crossing the first direction, a first power sharing line disposed between a first pixel disposed in a (2i)th (i is a natural number) horizontal line among the plurality of pixels and a second pixel disposed in a (2i−1)th horizontal line, and a second power sharing line disposed at one side of the first pixel or the other side of the second pixel.

In the display device according to various embodiments of the present disclosure, the first and second power sharing lines can respectively be connected to the plurality of subpixels.

In the display device according to various embodiments of the present disclosure, the plurality of subpixels can include first, second, third and fourth subpixels sequentially arranged along the first direction, a plurality of first power lines disposed to be parallel with the second direction at each of a left side of the first subpixel and a right side of the fourth subpixel, and a second power line disposed to be parallel with the first power line between the second subpixel and the third subpixel, the first power sharing line can be disposed between the plurality of first power lines and connected to each of the plurality of first power lines and each of the first to fourth subpixels, and the second power sharing line can include a first portion extended between the first subpixel and the second subpixel based on a center connected with the second power line and connected to each of the first and second subpixels, and a second portion extended between the third subpixel and the fourth subpixel and connected to each of the third and fourth subpixels.

In the display device according to various embodiments of the present disclosure, the first power sharing line can be connected to first branch power patterns respectively extended from the first to fourth subpixels, the first portion of the second power sharing line can be connected to second branch power patterns respectively extended from the first and second subpixels, and the second portion of the second power sharing line can be connected to second branch power patterns respectively extended from the third and fourth subpixels.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
   a first power sharing line disposed to be parallel with a first direction;
   a first pixel and a second pixel disposed along a second direction crossing the first direction with the first power sharing line interposed therebetween; and
   a second power sharing line disposed to be parallel with the first power sharing line with any one of the first and second pixels interposed therebetween,
   wherein each of the first and second pixels includes a plurality of subpixels arranged along the first direction,
   wherein the first power sharing line is connected to a first branch power pattern extended from each of the plurality of subpixels,
   wherein an active layer is included in each of the plurality of subpixels, and
   wherein the first branch power pattern is made of a same material as the active layer and is disposed to extend from the active layer of each of the plurality of subpixels in the second direction oriented toward the first power sharing line.

2. The display device of claim 1, further comprising a plurality of first power lines disposed to be parallel with the second direction with the first and second pixels interposed therebetween,
   wherein the first power sharing line is disposed between the plurality of first power lines and connected to each of the plurality of first power lines.

3. The display device of claim 2, wherein the first power sharing line is disposed between the plurality of first power lines in a straight-line shape.

4. The display device of claim 1, further comprising:
   a second power line disposed in the first and second pixels in parallel with the second direction,
   wherein the second power sharing line extends to both sides based on a center connected with the second power line.

5. The display device of claim 1,
   wherein the second power sharing line is connected to each of the plurality of subpixels included in any one of the first and second pixels.

6. The display device of claim 5, wherein the active layer partially overlaps a first power line while overlapping the first power sharing line.

7. The display device of claim 5, wherein the second power sharing line is connected to a second branch power pattern extended from each of the plurality of subpixels.

8. The display device of claim 7,
   wherein the second branch power pattern is made of the same material as the active layer and is disposed to extend from the active layer of each of the plurality of subpixels in the first direction parallel with the second power sharing line.

9. The display device of claim 8, wherein the active layer is connected to both ends of the second power sharing line.

10. The display device of claim 5, wherein the plurality of subpixels include a first subpixel, a second subpixel, a third subpixel and a fourth subpixel sequentially arranged along the first direction,
    a plurality of first power lines disposed to be parallel with the second direction are disposed at each of a left side of the first subpixel and a right side of the fourth subpixel, and
    a second power line disposed to be parallel with the first power line is disposed between the second subpixel and the third subpixel.

11. The display device of claim 10, wherein the first power sharing line is disposed between the plurality of first power lines and connected to each of the plurality of first power lines, and is connected to each of first branch power patterns respectively extended from the first to fourth subpixels.

12. The display device of claim 10, wherein the second power sharing line includes a first portion extended between the first subpixel and the second subpixel based on a center connected with the second power line, and a second portion extended between the third subpixel and the fourth subpixel,
    second branch power patterns respectively extended from the first and second subpixels are respectively connected to the first portion, and
    second branch power patterns respectively extended from the third and fourth subpixels are respectively connected to the second portion.

13. The display device of claim 12, wherein the first to fourth subpixels have a same electrical distance from a center of the second power sharing line connected with the second power line.

14. A display device comprising:
    a plurality of pixels having a plurality of subpixels arranged along a first direction and a second direction crossing the first direction;
    a first power sharing line disposed between a first pixel disposed in a (2i)th horizontal line among the plurality of pixels and a second pixel disposed in a (2i−1)th horizontal line, where I is a natural number; and
    a second power sharing line disposed at one side of the first pixel or another side of the second pixel,
    wherein the first power sharing line or the second power sharing line is connected to a first branch pattern extended from the first pixel or the second pixel,
    wherein an active layer is included in each of the first pixel and the second pixel, and
    wherein the first branch pattern is made of a same material as the active layer and is disposed to extend from the active layer of the first pixel or the second pixel toward the first power sharing line or the second power sharing line.

15. The display device of claim 14, wherein the first and second power sharing lines are respectively connected to the plurality of subpixels.

16. The display device of claim 15, wherein the plurality of subpixels include a first subpixel, a second subpixel, a third subpixel and a fourth subpixel sequentially arranged along the first direction, a plurality of first power lines disposed to be parallel with the second direction are disposed at each of a left side of the first subpixel and a right side of the fourth subpixel, a second power line disposed to be parallel with the first power line is disposed between the second subpixel and the third subpixel, the first power sharing line is disposed between the plurality of first power lines and connected to each of the plurality of first power lines and each of the first to fourth subpixels, and the second power sharing line includes a first portion extended between the first subpixel and the second subpixel based on a center connected with the second power line and connected to each of the first and second subpixels, and a second portion extended between the third subpixel and the fourth subpixel and connected to each of the third and fourth subpixels.

17. The display device of claim 16, wherein the first power sharing line is connected to first branch power patterns respectively extended from the first to fourth subpixels, the first portion of the second power sharing line is connected to second branch power patterns respectively extended from the first and second subpixels, and the second portion of the second power sharing line is connected to second branch power patterns respectively extended from the third and fourth subpixels.

18. A display device comprising:

a first power sharing line disposed to be parallel with a first direction;

a first pixel and a second pixel disposed along a second direction crossing the first direction with the first power sharing line interposed therebetween; and a second power sharing line disposed to be parallel with the first power sharing line with any one of the first and second pixels interposed therebetween, wherein each of the first and second pixels includes a plurality of subpixels arranged along the first direction, wherein the second power sharing line is connected to a second branch power pattern extended from each of the plurality of subpixels in any one of the first and second pixels, wherein an active layer is included in each of the plurality of subpixels in any one of the first and second pixels, and wherein the second branch power pattern is made of a same material as the active layer and is disposed to extend from the active layer of each of the plurality of subpixels in the first direction parallel with the second power sharing line.

* * * * *